(12) United States Patent
Moriya et al.

(10) Patent No.: US 8,835,907 B2
(45) Date of Patent: Sep. 16, 2014

(54) MEMORY DEVICE AND SEMICONDUCTOR DEVICE

(75) Inventors: Yoshitaka Moriya, Atsugi (JP); Yasuko Watanabe, Yokohama (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 646 days.

(21) Appl. No.: 11/793,810

(22) PCT Filed: Jan. 20, 2006

(86) PCT No.: PCT/JP2006/001263
§ 371 (c)(1),
(2), (4) Date: Jun. 22, 2007

(87) PCT Pub. No.: WO2006/078065
PCT Pub. Date: Jul. 27, 2006

(65) Prior Publication Data
US 2008/0121874 A1    May 29, 2008

(30) Foreign Application Priority Data
Jan. 21, 2005 (JP) ................. 2005-014617

(51) Int. Cl.
| | | |
|---|---|---|
| H01L 29/08 | (2006.01) | |
| H01L 27/12 | (2006.01) | |
| H01L 21/84 | (2006.01) | |
| H01L 23/522 | (2006.01) | |
| H01L 27/13 | (2006.01) | |
| H01L 21/56 | (2006.01) | |
| H01L 21/683 | (2006.01) | |
| H01L 27/105 | (2006.01) | |
| H01L 23/00 | (2006.01) | |

(52) U.S. Cl.
CPC ....... *H01L 21/84* (2013.01); *H01L 2924/19041* (2013.01); *H01L 27/12* (2013.01); *H01L 27/1214* (2013.01); *H01L 2221/68363* (2013.01); *H01L 23/5227* (2013.01); *H01L 2924/01079* (2013.01); *H01L 27/13* (2013.01); *H01L 2221/68327* (2013.01); *H01L 21/56* (2013.01); *H01L 21/6835* (2013.01); *H01L 2221/68318* (2013.01); *H01L 21/6836* (2013.01); *H01L 27/105* (2013.01); *H01L 2924/01055* (2013.01); *H01L 2924/12044* (2013.01); *H01L 2224/83851* (2013.01); *H01L 24/83* (2013.01); *H01L 2924/01012* (2013.01); *H01L 27/1203* (2013.01); *H01L 2924/01068* (2013.01)
USPC .. 257/40; 257/4; 257/E51.003; 257/E51.005; 438/28; 438/152; 349/151

(58) Field of Classification Search
USPC ......... 349/151; 438/152, 28; 257/4, E51.003, 257/40, E51.005
See application file for complete search history.

(56) References Cited

U.S. PATENT DOCUMENTS

| | | | |
|---|---|---|---|
| 4,860,254 | A | 8/1989 | Pott et al. |
| 6,700,796 | B2 | 3/2004 | Detcheverry et al. |
| 6,714,392 | B2 | 3/2004 | Opolka et al. |
| 6,773,929 | B2 | 8/2004 | Oh et al. |
| 6,795,339 | B2 | 9/2004 | Ooishi |
| 6,812,509 | B2 | 11/2004 | Xu |
| 6,818,920 | B2 | 11/2004 | De Leeuw et al. |
| 6,927,437 | B2 | 8/2005 | Oh et al. |
| 7,105,365 | B2 | 9/2006 | Hiroki et al. |
| 7,157,847 | B2 | 1/2007 | Kawachi et al. |
| 7,518,692 | B2 | 4/2009 | Yamazaki et al. |
| 7,674,635 | B2 | 3/2010 | Hiroki et al. |
| 7,675,232 | B2 | 3/2010 | Kawachi et al. |
| 7,816,721 | B2 | 10/2010 | Yamazaki et al. |
| 2001/0045593 | A1 | 11/2001 | De Leeuw et al. |
| 2002/0066942 | A1 | 6/2002 | Opolka et al. |
| 2002/0132383 | A1* | 9/2002 | Hiroki et al. ............. 438/17 |
| 2002/0192886 | A1 | 12/2002 | Inoue |
| 2003/0042572 | A1 | 3/2003 | Detcheverry et al. |
| 2003/0053351 | A1 | 3/2003 | Oh et al. |
| 2003/0132430 | A1 | 7/2003 | Tsai |
| 2003/0156449 | A1 | 8/2003 | Ooishi |

| | | |
|---|---|---|
| 2004/0002176 A1 | 1/2004 | Xu |
| 2004/0004218 A1 | 1/2004 | Jinno |
| 2004/0129450 A1* | 7/2004 | Yamazaki et al. ............ 174/250 |
| 2004/0164302 A1 | 8/2004 | Arai et al. |
| 2004/0189625 A1 | 9/2004 | Sato |
| 2004/0211997 A1 | 10/2004 | Oh et al. |
| 2004/0245525 A1 | 12/2004 | Yamazaki et al. |
| 2007/0176622 A1 | 8/2007 | Yamazaki |
| 2008/0042180 A1 | 2/2008 | Yamazaki et al. |
| 2008/0210928 A1* | 9/2008 | Abe et al. ........................ 257/40 |
| 2009/0009440 A1 | 1/2009 | Kawachi et al. |
| 2010/0157165 A1 | 6/2010 | Hiroki et al. |
| 2011/0031469 A1 | 2/2011 | Yamazaki et al. |

FOREIGN PATENT DOCUMENTS

| | | |
|---|---|---|
| EP | 1437683 A | 7/2004 |
| EP | 1 453 088 | 9/2004 |
| EP | 1453088 A2 * | 9/2004 |
| JP | 2000-020665 A | 1/2000 |
| JP | 2000020665 A * | 1/2000 |
| JP | 2001-189431 A | 7/2001 |
| JP | 2001-345431 A | 12/2001 |
| JP | 2002-026283 A | 1/2002 |
| JP | 2003-031814 A | 1/2003 |
| JP | 2003-168570 A | 6/2003 |
| JP | 2003-243631 A | 8/2003 |
| JP | 2004-128471 | 4/2004 |
| JP | 2004-220591 A | 8/2004 |
| JP | 2004-282050 | 10/2004 |
| WO | WO-01/61644 | 8/2001 |
| WO | WO 2004/015778 | 2/2004 |
| WO | WO-2005/086088 | 9/2005 |
| WO | WO 2006043687 A1 * | 4/2006 |
| WO | WO-2006/051996 | 5/2006 |

OTHER PUBLICATIONS

International Search Report (Application No. PCT/JP2006/301263) dated Apr. 11, 2006.

Written Opinion (Application No. PCT/JP2006/301263) dated Apr. 11, 2006.

European Search Report (Application no. 06701408.4) Dated Aug. 12, 2011.

European Office Action (Application No. 06701408.4; PCTEP08478) Dated Sep. 11, 2013.

* cited by examiner

*Primary Examiner* — Alexander Sofocleous
*Assistant Examiner* — John P Dulka
(74) *Attorney, Agent, or Firm* — Eric J. Robinson; Robinson Intellectual Property Law Office, P.C.

(57) ABSTRACT

The present invention is to provide a semiconductor device in which the step can be simplified, the manufacturing cost can be suppressed, and the decrease in yield can be suppressed. A semiconductor device of the present invention includes an antenna, a storage element, and a transistor, wherein a conductive layer serving as an antenna is provided in the same layer as a conductive layer of the transistor or the storage element. This characteristic makes it possible to omit an independent step of forming the conductive layer serving as an antenna and to conduct the step of forming the conductive layer serving as an antenna at the same time as the step of forming a conductive layer of another element. Therefore, the manufacturing step can be simplified, the manufacturing cost can be suppressed, and the decrease in yield can be suppressed.

9 Claims, 19 Drawing Sheets

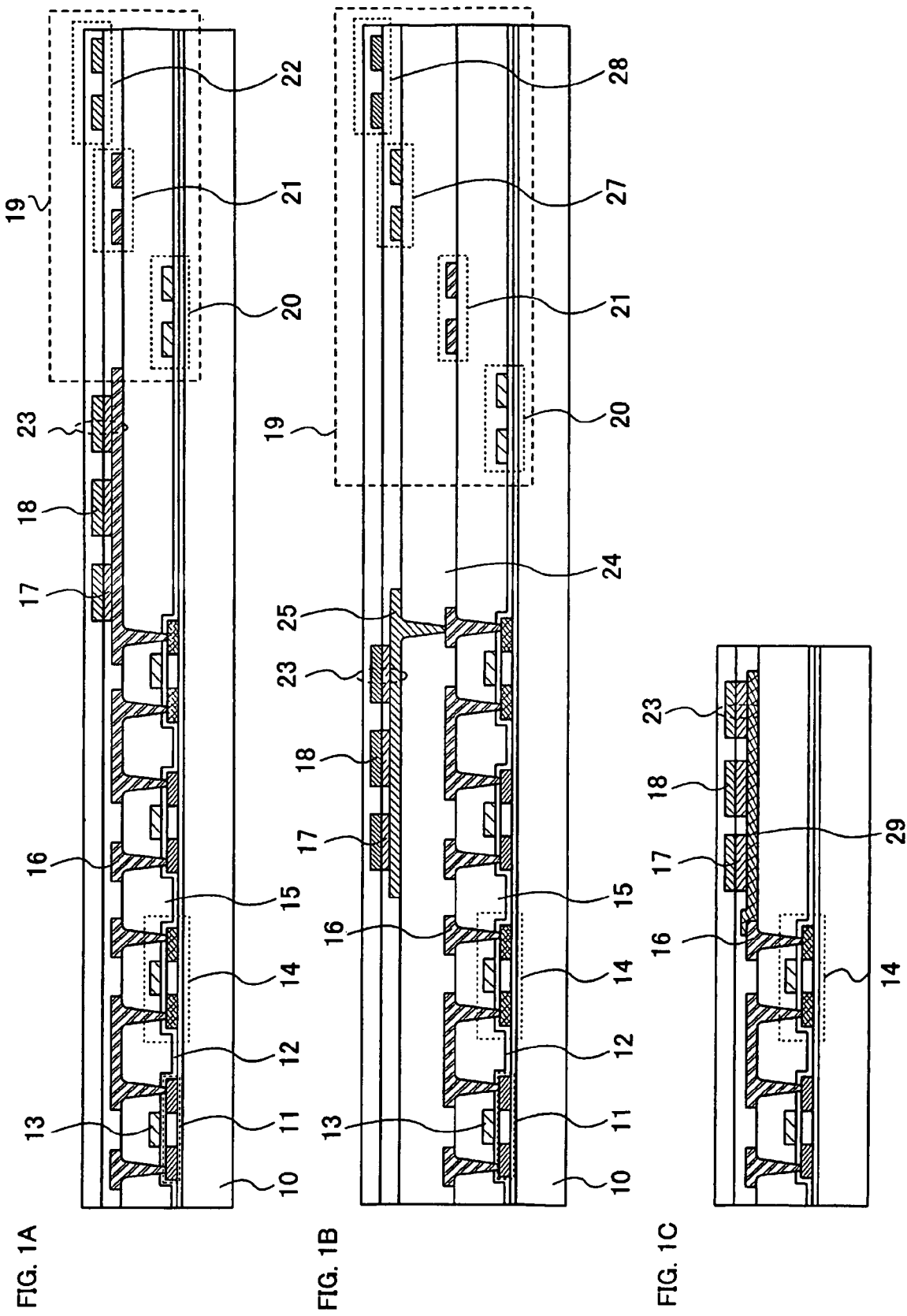

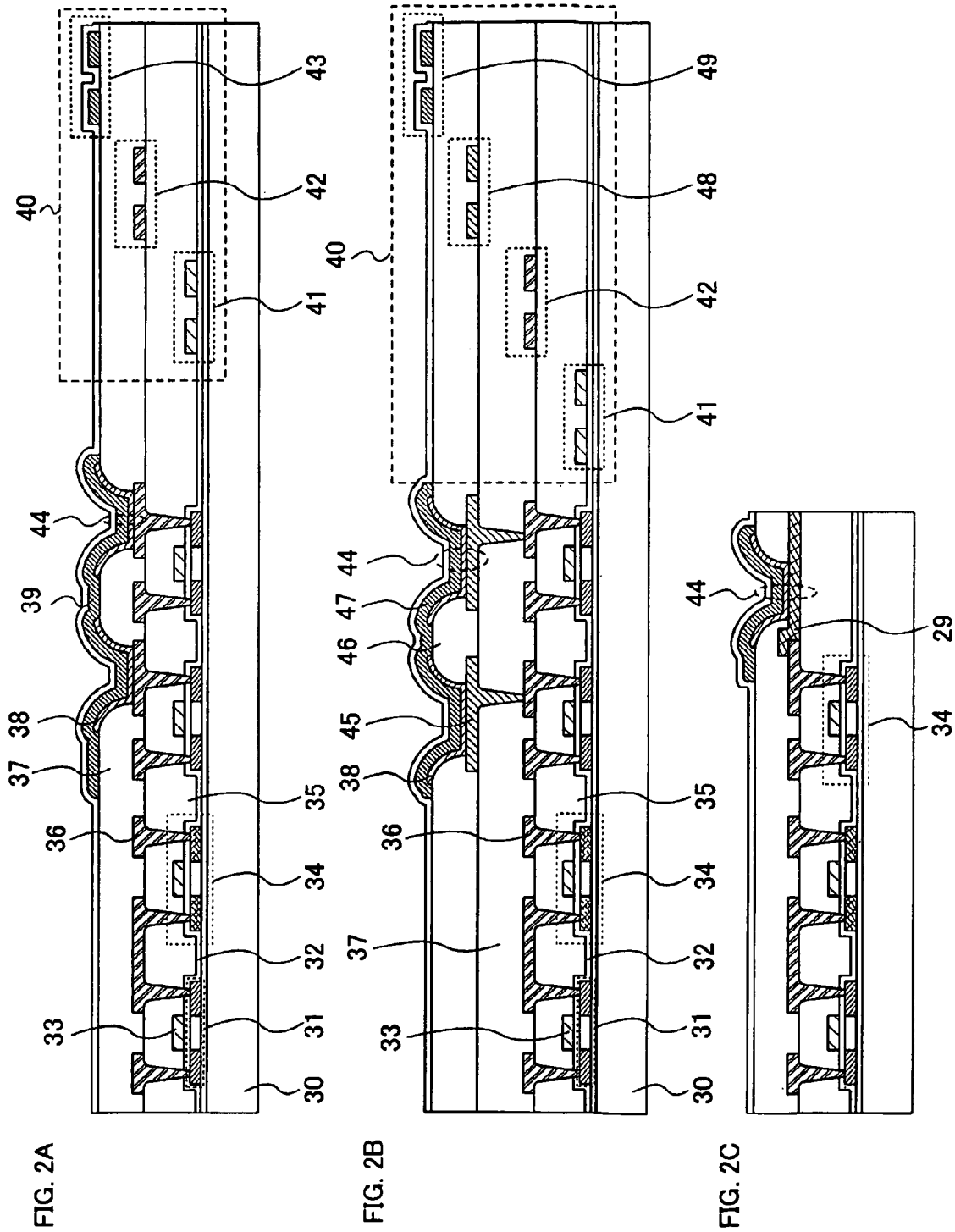

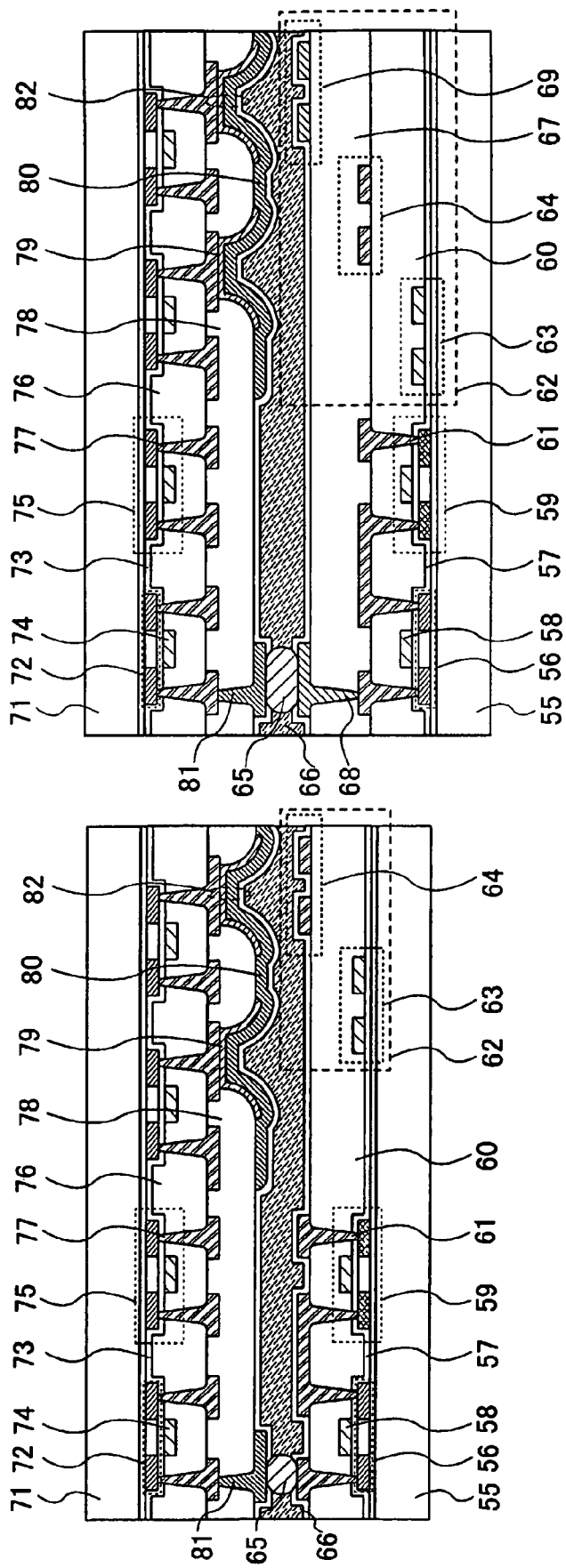

FIG. 10A
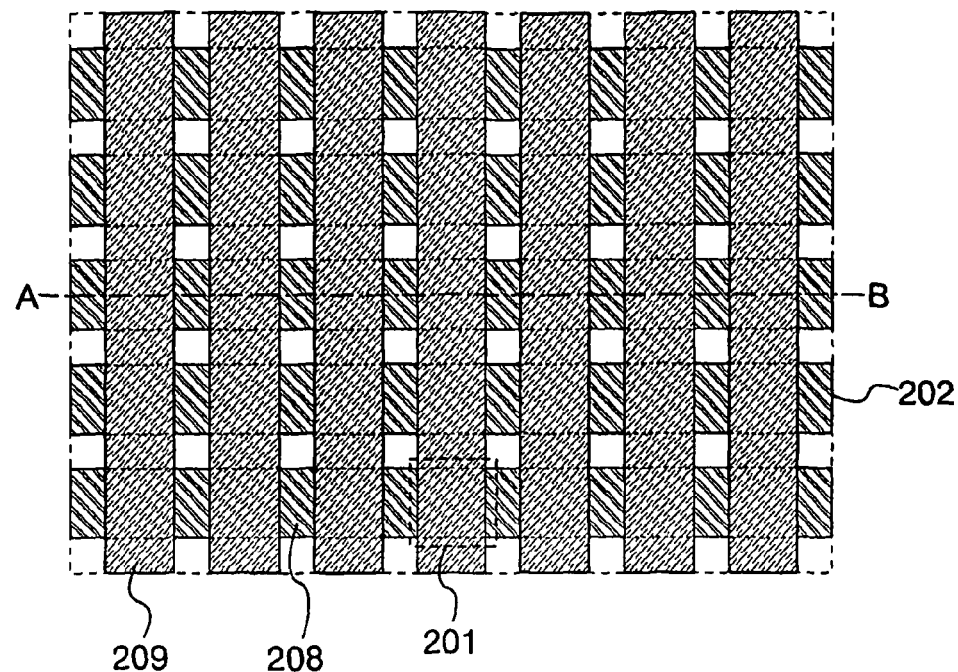
FIG. 10B(1)
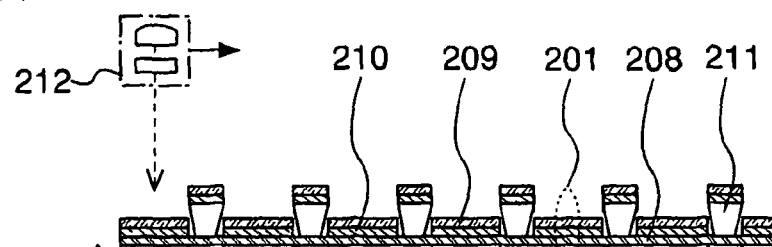
FIG. 10B(2)
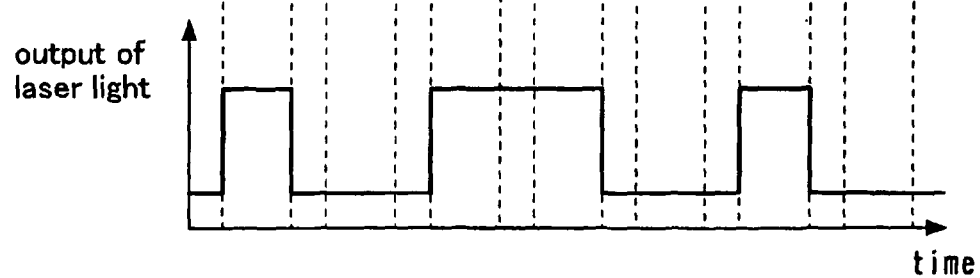

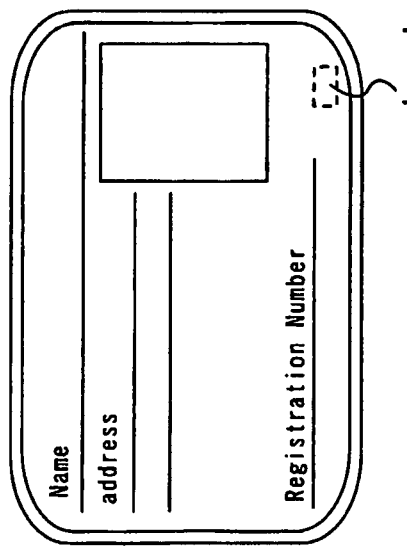

MEMORY DEVICE AND SEMICONDUCTOR DEVICE

TECHNICAL FIELD

The present invention relates to a semiconductor device which can send and receive data wirelessly.

BACKGROUND ART

In recent years, development of semiconductor devices which send and receive data wirelessly has been extensively advanced. Such semiconductor devices are referred to as IC chips, IC tags, RF chips, RF tags, wireless chips, wireless tags, electronic chips, electronic tags, wireless processors, wireless memories, or the like (for example, see Reference 1: Japanese Patent Application Laid-Open No. 2000-20665).

Some of such semiconductor devices include antennas, storage elements, and transistors. The antenna is provided to receive an electric wave and the storage element is provided to store some kind of information. The transistor is provided as an element for constituting a part of a logic circuit which controls operation of the antenna, the storage element, and the like.

DISCLOSURE OF INVENTION

As above, a semiconductor device which sends and receives data wirelessly preferably has a structure including three of a transistor, a storage element, and an antenna. However, such a structure has problems in that the number of steps increases, the manufacturing cost increases, the yield decreases, and so on. Therefore, it is an object of the present invention to provide a semiconductor device in which the step is simplified, the manufacturing cost is suppressed, and the decrease in the yield is suppressed.

In the present invention made in view of the above problems, a conductive layer serving as an antenna is provided in the same layer as a conductive layer of another element. Moreover, the step of forming the conductive layer serving as an antenna is not provided independently, but the step of forming the conductive layer serving as an antenna is conducted at the same time as the step of forming a conductive layer of another element. This makes it possible to simplify the manufacturing step.

Further, the present invention provides a semiconductor device including a storage element having a simple structure in which a layer containing an organic compound is sandwiched between a pair of conductive layers. This characteristic can achieve the simplification of the manufacturing step and moreover provide a semiconductor device including a nonvolatile and additionally recordable storage element.

A semiconductor device of the present invention comprises a transistor including a semiconductor layer, a first insulating layer serving as a gate insulating layer, and a first conductive layer serving as a gate electrode; a second insulating layer covering the transistor; a second conductive layer connected to an impurity region in the semiconductor layer through an opening portion provided in the second insulating layer; a layer containing an organic compound connected to the second conductive layer; a third conductive layer connected to the layer containing an organic compound; and a fourth conductive layer serving as an antenna.

In the semiconductor device having the above structure, the fourth conductive layer is provided in the same layer as the first conductive layer, the second conductive layer, or the third conductive layer. Moreover, the fourth conductive layer is formed at the same time as the first conductive layer, the second conductive layer, or the third conductive layer and includes the same material as the first conductive layer, the second conductive layer, or the third conductive layer.

A semiconductor device of the present invention comprises a transistor including a semiconductor layer, a first insulating layer serving as a gate insulating layer, and a first conductive layer serving as a gate electrode; a second insulating layer covering the transistor; a second conductive layer (corresponding to a source wiring or a drain wiring) connected to an impurity region in the semiconductor layer through an opening portion provided in the second insulating layer; a third insulating layer covering the second conductive layer; a third conductive layer connected to the second conductive layer through an opening portion provided in the third insulating layer; a layer containing an organic compound connected to the third conductive layer; a fourth conductive layer connected to the layer containing an organic compound; and a fifth conductive layer serving as an antenna.

In the semiconductor device having the above structure, the fifth conductive layer is provided in the same layer as the first conductive layer, the second conductive layer, the third conductive layer, or the fourth conductive layer. Moreover, the fifth conductive layer is formed at the same time as the first conductive layer, the second conductive layer, the third conductive layer, or the fourth conductive layer, and includes the same material as the first conductive layer, the second conductive layer, the third conductive layer, or the fourth conductive layer.

A semiconductor device of the present invention comprises a transistor including a semiconductor layer, a first insulating layer serving as a gate insulating layer, and a first conductive layer serving as a gate electrode; a second insulating layer covering the transistor; a second conductive layer (corresponding to a source wiring or a drain wiring) connected to an impurity region in the semiconductor layer through an opening portion provided in the second insulating layer; a third insulating layer covering the second conductive layer; a layer containing an organic compound connected to the second conductive layer through an opening portion provided in the third insulating layer; a third conductive layer in contact with the layer containing an organic compound; and a fourth conductive layer serving as an antenna.

In the semiconductor device having the above structure, the fourth conductive layer is provided in the same layer as the first conductive layer, the second conductive layer, or the third conductive layer. Moreover, the fourth conductive layer is formed at the same time as the first conductive layer, the second conductive layer, or the third conductive layer, and includes the same material as the first conductive layer, the second conductive layer, or the third conductive layer.

A semiconductor device of the present invention comprises a transistor including a semiconductor layer, a first insulating layer serving as a gate insulating layer, and a first conductive layer serving as a gate electrode; a second insulating layer covering the transistor; a second conductive layer (corresponding to a source wiring or a drain wiring) connected to an impurity region in the semiconductor layer through an opening portion provided in the second insulating layer; a third insulating layer covering the second conductive layer; a third conductive layer connected to the second conductive layer through an opening portion provided in the third insulating layer; a fourth insulating layer covering the third conductive layer; a layer containing an organic compound connected to the third conductive layer through an opening portion provided in the fourth insulating layer; a fourth conductive layer connected to the layer containing an organic compound; and a fifth conductive layer serving as an antenna.

In the semiconductor device having the above structure, the fifth conductive layer is provided in the same layer as the first conductive layer, the second conductive layer, the third conductive layer, or the fourth conductive layer. Moreover, the fifth conductive layer is formed at the same time as the first conductive layer, the second conductive layer, the third conductive layer, or the fourth conductive layer, and includes the same material as the first conductive layer, the second conductive layer, the third conductive layer, or the fourth conductive layer.

In a semiconductor device of the present invention, a first conductive layer, a layer containing an organic compound connected to the first conductive layer, and a second conductive layer connected to the layer containing an organic compound are provided over a first base. Over a second base, a transistor including a semiconductor layer, a first insulating layer serving as a gate insulating layer, and a third conductive layer serving as a gate electrode; a second insulating layer covering the transistor; a fourth conductive layer (corresponding to a source wiring or a drain wiring) connected to an impurity region in the semiconductor layer through an opening portion provided in the second insulating layer; and a fifth conductive layer serving as an antenna are provided.

In the semiconductor device having the above structure, the first base and the second base are pasted to each other through a layer including a conductive particle so that the first conductive layer is in contact with the fourth conductive layer or the second conductive layer is in contact with the fourth conductive layer, and the fifth conductive layer is provided in the same layer as the third conductive layer or the fourth conductive layer and formed at the same time as the third conductive layer or the fourth conductive layer. Moreover, the fifth conductive layer includes the same material as the third conductive layer or the fourth conductive layer.

In a semiconductor device of the present invention, a first conductive layer, a layer containing an organic compound connected to the first conductive layer, and a second conductive layer connected to the layer containing an organic compound are provided over a first base. Over a second base, a transistor including a semiconductor layer, a first insulating layer serving as a gate insulating layer, and a third conductive layer serving as a gate electrode; a second insulating layer covering the transistor; a fourth conductive layer (corresponding to a source wiring or a drain wiring) connected to an impurity region in the semiconductor layer through an opening portion provided in the second insulating layer; a third insulating layer covering the fourth conductive layer; a fifth conductive layer connected to the fourth conductive layer through an opening portion provided in the third insulating layer; and a sixth conductive layer serving as an antenna are provided.

In the semiconductor device having the above structure, the first base and the second base are pasted to each other through a layer including a conductive particle so that the first conductive layer is in contact with the fifth conductive layer or the second conductive layer is in contact with the fifth conductive layer, and the sixth conductive layer is provided in the same layer as the fourth conductive layer or the fifth conductive layer and formed at the same time as the fourth conductive layer or the fifth conductive layer. Moreover, the sixth conductive layer includes the same material as the fourth conductive layer or the fifth conductive layer.

A semiconductor device of the present invention comprises, over a first base, a first transistor including a first semiconductor layer, a first insulating layer serving as a gate insulating layer, and a first conductive layer serving as a gate electrode; a second insulating layer covering the first transistor; a second conductive layer (corresponding to a source wiring or a drain wiring) connected to an impurity region in the first semiconductor layer through an opening portion provided in the second insulating layer; a layer containing an organic compound connected to the second conducive layer; and a third conductive layer connected to the layer containing an organic compound.

In addition to the above structure, the semiconductor device comprises, over a second base, a second transistor including a second semiconductor layer, a third insulating layer serving as a gate insulating layer, and a fourth conductive layer serving as a gate electrode; a fourth insulating layer covering the second transistor; a fifth conductive layer (corresponding to a source wiring or a drain wiring) connected to an impurity region in the second semiconductor layer through an opening portion provided in the fourth insulating layer; and a sixth conductive layer serving as an antenna.

In the semiconductor device having the above structure, the first base and the second base are pasted to each other through a layer including a conductive particle so that the third conductive layer is in contact with the fifth conductive layer. Moreover, the sixth conductive layer is provided in the same layer as the fourth conductive layer or the fifth conductive layer, formed at the same time as the fourth conductive layer or the fifth conductive layer, and includes the same material as the fourth conductive layer or the fifth conductive layer.

A semiconductor device of the present invention comprises, over a first base, a first transistor including a first semiconductor layer, a first insulating layer serving as a gate insulating layer, and a first conductive layer serving as a gate electrode; a second insulating layer covering the first transistor; a second conductive layer (corresponding to a source wiring or a drain wiring) connected to an impurity region in the first semiconductor layer through an opening portion provided in the second insulating layer; a layer containing an organic compound connected to the second conductive layer; and a third conductive layer connected to the layer containing an organic compound.

In addition to the above structure, the semiconductor device comprises, over a second base, a second transistor including a second semiconductor layer, a third insulating layer serving as a gate insulating layer, and a fourth conductive layer serving as a gate electrode; a fourth insulating layer covering the second transistor; a fifth conductive layer (corresponding to a source wiring or a drain wiring) connected to an impurity region in the second semiconductor layer through an opening portion provided in the fourth insulating layer; a fifth insulating layer covering the fifth conductive layer; a sixth conductive layer connected to the fifth conductive layer through an opening portion provided in the fifth insulating layer; and a seventh conductive layer serving as an antenna.

In the semiconductor device having the above structure, the first base and the second base are pasted to each other through a layer including a conductive particle so that the third conductive layer is in contact with the sixth conductive layer. Moreover, the seventh conductive layer is provided in the same layer as the fourth conductive layer, the fifth conductive layer, or the sixth conductive layer, formed at the same time as the fourth conductive layer, the fifth conductive layer, or the sixth conductive layer, and includes the same material as the fourth conductive layer, the fifth conductive layer, or the sixth conductive layer.

A semiconductor device of the present invention comprises, over a first base, a first conductive layer; a layer containing an organic compound connected to the first conductive layer; a second conductive layer connected to the layer containing an organic compound; and a third conductive layer serving as an antenna. Moreover, the semiconductor device comprises, over a second base, a transistor including a semiconductor layer, a first insulating layer serving as a gate insulating layer, and a fourth conductive layer serving as a gate electrode; a second insulating layer covering the transistor; and a fifth conductive layer (corresponding to a source wiring or a drain wiring) connected to an impurity region in the semiconductor layer through an opening portion provided in the second insulating layer.

In the semiconductor device having the above structure, the first base and the second base are pasted to each other through a layer including a conductive particle so that the first conductive layer is in contact with the fifth conductive layer or the second conductive layer is in contact with the fifth conductive layer, and the third conductive layer is provided in the same layer as the first conductive layer or the second conductive layer, formed at the same time as the first conductive layer or the second conductive layer, and includes the same material as the first conductive layer or the second conductive layer.

A semiconductor device of the present invention comprises, over a base, a first conductive layer, a layer containing an organic compound connected to the first conductive layer, and a second conductive layer connected to the layer containing an organic compound.

In addition to the above structure, the semiconductor device comprises a layer including a conductive particle covering the second conductive layer, a second insulating layer covering the layer including a conductive particle, a semiconductor layer over the second insulating layer, a third insulating layer over the semiconductor layer, a third conductive layer over the third insulating layer, a fourth insulating layer covering the third conductive layer, and a fourth conductive layer (corresponding to a source wiring or a drain wiring) connected to an impurity region in the semiconductor layer through an opening portion provided in the fourth insulating layer.

In addition to the above structure, the semiconductor device comprises a fifth conductive layer connected to the layer including a conductive particle through an opening portion provided in the second insulating layer and the fourth insulating layer, and a sixth conductive layer serving as an antenna.

In the semiconductor device having the above structure, the sixth conductive layer is provided in the same layer as the third conductive layer or the fourth conductive layer. Moreover, the sixth conductive layer is formed at the same time as the third conductive layer or the fourth conductive layer, and includes the same material as the third conductive layer or the fourth conductive layer.

A semiconductor device of the present invention comprises, over a base, a first conductive layer, a layer containing an organic compound layer connected to the first conductive layer, and a second conductive layer connected to the layer containing an organic compound.

In addition to the above structure, the semiconductor device comprises a layer including a conductive particle covering the second conductive layer, a second insulating layer covering the layer including a conductive particle, a semiconductor layer over the second insulating layer, a third insulating layer over the semiconductor layer, a third conductive layer over the third insulating layer, a fourth insulating layer covering the third conductive layer, and a fourth conductive layer (corresponding to a source wiring or a drain wiring) connected to an impurity region in the semiconductor layer through an opening portion provided in the fourth insulating layer.

In addition to the above structure, the semiconductor device comprises a fifth conductive layer connected to the layer including a conductive particle through an opening portion provided in the second insulating layer and the fourth insulating layer, a fifth insulating layer covering the fourth conductive layer and the fifth conductive layer, a sixth conductive layer connected to the fourth conductive layer through an opening portion provided in the fifth insulating layer, and a seventh conductive layer serving as an antenna.

In the semiconductor device having the above structure, the seventh conductive layer is provided in the same layer as the third conductive layer, the fourth conductive layer, or the sixth conductive layer. Moreover, the seventh conductive layer is formed at the same time as the third conductive layer, the fourth conductive layer, or the sixth conductive layer and includes the same material as the third conductive layer, the fourth conductive layer, or the sixth conductive layer.

A semiconductor device of the present invention comprises, over a base, a first transistor including a first semiconductor layer, a first insulating layer serving as a gate insulating layer, and a first conductive layer serving as a gate electrode; a second insulating layer covering the first transistor; and a second conductive layer (corresponding to a source wiring or a drain wiring) connected to an impurity region in the first semiconductor layer through an opening portion provided in the second insulating layer.

In addition to the above structure, the semiconductor device comprises a third insulating layer covering the second conductive layer, a third conductive layer connected to the second conductive layer through an opening portion provided in the third insulating layer, a layer containing an organic compound connected to the second conductive layer through an opening portion provided in the third insulating layer, and a fourth conductive layer connected to the layer containing an organic compound.

In addition to the above structure, the semiconductor device comprises a layer including a conductive particle covering the fourth conductive layer, a fourth insulating layer covering the layer including a conductive particle, a second semiconductor layer over the fourth insulating layer, a fifth insulating layer over the second semiconductor layer, a fifth conductive layer over the fifth insulating layer, a sixth insulating layer over the fifth conductive layer, and a sixth conductive layer (corresponding to a source wiring or a drain wiring) connected to an impurity region in the second semiconductor layer through an opening portion provided in the sixth insulating layer.

In addition to the above structure, the semiconductor device comprises a seventh conductive layer connected to the layer including a conductive particle through an opening portion provided in the fourth insulating layer and the sixth insulating layer, and an eighth conductive layer serving as an antenna.

In the semiconductor device having the above structure, the eighth conductive layer is provided in the same layer as the fifth conductive layer or the sixth conductive layer. The eighth conductive layer is formed at the same time as the fifth conductive layer or the sixth conductive layer and includes the same material as the fifth conductive layer or the sixth conductive layer.

A semiconductor device of the present invention comprises, over a base, a first transistor including a first semiconductor layer, a first insulating layer serving as a gate insulating layer, and a first conductive layer serving as a gate electrode; a second insulating layer covering the first transistor; and a second conductive layer (corresponding to a source wiring or a drain wiring) connected to an impurity region in the first semiconductor layer through an opening portion provided in the second insulating layer.

In addition to the above structure, the semiconductor device comprises a third insulating layer covering the second conductive layer, a third conductive layer connected to the second conductive layer through an opening portion provided in the third insulating layer, a layer containing an organic compound connected to the second conductive layer through an opening portion provided in the third insulating layer, and a fourth conductive layer connected to the layer containing an organic compound.

In addition to the above structure, the semiconductor device comprises a layer including a conductive particle covering the fourth conductive layer, a fourth insulating layer covering the layer including a conductive particle, a second semiconductor layer over the fourth insulating layer, a fifth insulating layer over the second semiconductor layer, a fifth conductive layer over the fifth insulating layer, a sixth insulating layer over the fifth conductive layer, and a sixth conductive layer (corresponding to a source wiring or a drain wiring) connected to an impurity region in the second semiconductor layer through an opening portion provided in the sixth insulating layer.

In addition to the above structure, the semiconductor device comprises a seventh conductive layer connected to the layer including a conductive particle through an opening portion provided in the fourth insulating layer and the sixth insulating layer, a seventh insulating layer covering the sixth conductive layer and the seventh conductive layer, an eighth conductive layer connected to the sixth conductive layer through an opening portion provided in the seventh insulating layer, and a ninth conductive layer serving as an antenna.

In the semiconductor device having the above structure, the ninth conductive layer is provided in the same layer as the fifth conductive layer, the sixth conductive layer, or the eighth conductive layer. The ninth conductive layer is formed at the same time as the fifth conductive layer, the sixth conductive layer, or the eighth conductive layer and includes the same material as the fifth conductive layer, the sixth conductive layer, or the eighth conductive layer.

A semiconductor device of the present invention comprises, over a base, a first conductive layer, a layer containing an organic compound connected to the first conductive layer, and a second conductive layer connected to the layer containing an organic compound.

In addition to the above structure, the semiconductor device comprises a third conductive layer serving as an antenna, a layer including a conductive particle over the second conductive layer, a first insulating layer over the layer including a conductive particle, a semiconductor layer over the first insulating layer, a second insulating layer over the semiconductor layer, a fourth conductive layer over the second insulating layer, a third insulating layer covering the fourth conductive layer, a fifth conductive layer (corresponding to a source wiring or a drain wiring) connected to an impurity region in the semiconductor layer through an opening portion provided in the third insulating layer, and a sixth conductive layer connected to the layer including a conductive particle through an opening portion provided in the first insulating layer and the third insulating layer.

In the semiconductor device having the above structure, the third conductive layer is provided in the same layer as the first conductive layer or the second conductive layer. The third conductive layer is formed at the same time as the first conductive layer or the second conductive layer and includes the same material as the first conductive layer or the second conductive layer.

In the semiconductor device of the present invention having any one of the above structures, the conductive layer serving as an antenna is provided in the same layer as a conductive layer in a transistor or a storage element. This makes it possible to omit the independent step of forming the conductive layer serving as an antenna and to conduct the step of forming the conductive layer serving as an antenna at the same time as the step of forming a conductive layer of another element. Therefore, the manufacturing step can be simplified.

BRIEF DESCRIPTION OF DRAWINGS

In the accompanying drawings:
FIGS. 1A to 1C show a semiconductor device of the present invention;
FIGS. 2A to 2C show a semiconductor device of the present invention;
FIGS. 4A and 4B show a semiconductor device of the present invention;
FIGS. 10A to 10B(2) show a semiconductor device of the present invention;
FIGS. 18A to 18E show usage patterns of a semiconductor device of the present invention.

BEST MODE FOR CARRYING OUT THE INVENTION

Figure 3A:
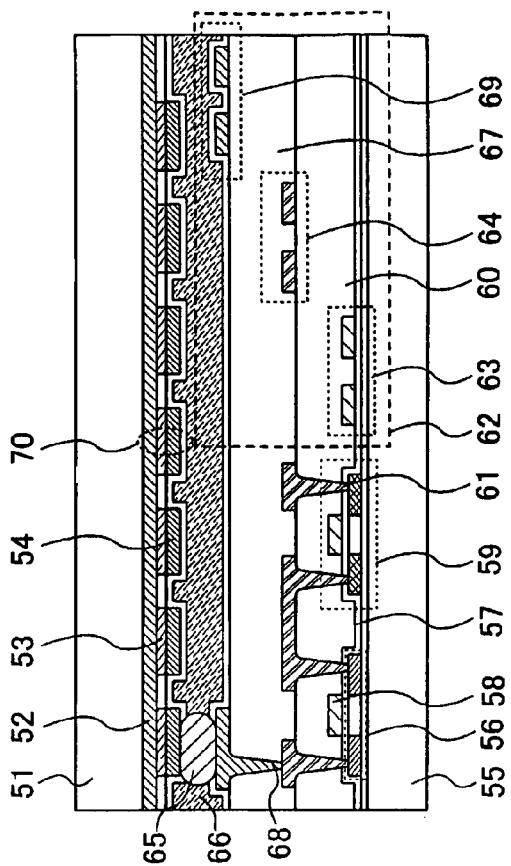
FIGS. 3A and 3B show a semiconductor device of the present invention.

Embodiment Modes and Embodiments are hereinafter described with reference to the drawings. However, the present invention is not limited to the following description and it is to be understood by those skilled in the art that the mode and detail can be variously changed without departing from the spirit and scope of the present invention. Therefore, the present invention is not construed as being limited to the description of Embodiment Modes and Embodiments hereinafter shown. It is to be noted that reference numerals indicating the same parts are used in common through different drawings in Embodiment Modes and Embodiments of the present invention.

[Embodiment Mode 1]

Embodiment Mode 1 will describe a structure of a semiconductor device in which a transistor, a storage element, and an antenna are provided over one base.

A semiconductor device of the present invention has, over a base (also referred to as a substrate) 10, a transistor 14 including a semiconductor layer 11, an insulating layer 12 serving as a gate insulating layer, and a conductive layer 13 serving as a gate electrode; an insulating layer 15 covering the transistor 14; a conductive layer 16 connected to an impurity region in the semiconductor layer 11 through an opening portion provided in the insulating layer 15; a layer 17 containing an organic compound connected to the conductive layer 16; a conductive layer 18 connected to the layer 17 containing an organic compound; and a conductive layer 19 serving as an antenna (refer to FIG. 1A).

Moreover, the semiconductor device of the present invention has a base insulating film interposed between the base 10 and the semiconductor layer 11, an insulating film provided between the adjacent to the layers 17 containing the organic compound, an insulating film covering the conductive layer 18 and a conductive layer 22 (refer to FIG. 1A).

In the above structure, the conductive layer 19 serving as an antenna corresponds to a conductive layer 20, a conductive layer 21, or the conductive layer 22. The conductive layer 20 is provided in the same layer as the conductive layer 13, the conductive layer 21 is provided in the same layer as the conductive layer 16, and the conductive layer 22 is provided in the same layer as the conductive layer 18. In other words, the conductive layer 19 is provided in the same layer as the conductive layer 13, the conductive layer 16, or the conductive layer 18. Therefore, it is not necessary to provide independently the step of forming the conductive layer 19 serving as an antenna, and the step of forming the conductive layer serving as an antenna can be conducted at the same time as the step of forming a conductive layer of another element. Therefore, the manufacturing step can be simplified.

In the above structure, a storage element 23 corresponds to a laminated body including the conductive layer 16, the layer 17 containing an organic compound, and the conductive layer 18. Since the storage element 23 including a three-layer body has a simple structure, the storage element 23 can be easily manufactured, which contributes to simplification of the manufacturing step.

In the above structure, the conductive layer 16 serves as a source wiring or a drain wiring, and moreover, as one element for constituting a part of the storage element 23. Thus, since the conductive layer 16 has two functions, the manufacturing step can be simplified further.

In some cases, data can be easily read from the storage element or data can be easily written in the storage element, if the conductive layer serving as the source wiring or the drain wiring of the transistor and the conductive layer in the storage element are formed with different materials. In such cases, a conductive layer 29 is preferably provided as another conductive layer in the storage element (refer to FIG. 1C). Then, the conductive layer 16 serving as the source wiring or the drain wiring of the transistor 14 is preferably connected electrically to the conductive layer 29.

The base 10 corresponds to a glass substrate, a quartz substrate, a metal substrate with an insulating layer formed over one surface thereof, a stainless steel substrate with an insulating layer formed over one surface thereof, a substrate including an organic resin (for example, a plastic substrate), a film (for example, including polypropylene, polyester, vinyl, polyvinyl fluoride, vinyl chloride, or the like), a piece of paper including a fibrous material, a multilayer film including a base film (for example, polyester, polyamide, an inorganic evaporation film, paper, or the like) and an adhesive synthetic resin film (such as an acrylic synthetic resin or an epoxy synthetic resin), or the like. The film is attached by melting an adhesive layer provided on a top surface or a layer provided on an outermost layer (not the adhesive layer) through a heat treatment and applying pressure thereto.

A peeling layer may be provided between the base 10 and an element group including the transistor 14. Then, by using the peeling layer, the base 10 and the element group including the transistor 14 may be separated.

Next, a structure of a semiconductor device of the present invention which is different from the above one will be described.

A semiconductor device of the present invention comprises, over a base (also referred to as a substrate) 10, a transistor 14 including a semiconductor layer 11, an insulating layer 12 serving as a gate insulating layer, and a conductive layer 13 serving as a gate electrode; an insulating layer 15 covering the transistor 14; a conductive layer 16 connected to an impurity region in the semiconductor layer 11 through an opening portion provided in the insulating layer 15; an insulating layer 24 covering the conductive layer 16; a conductive layer 25 connected to the conductive layer 16 through an opening portion provided in the insulating layer 24; a layer 17 containing an organic compound connected to the conductive layer 25; a conductive layer 18 connected to the layer 17 containing an organic compound; and a conductive layer 19 serving as an antenna (refer to FIG. 1B).

Moreover, the semiconductor device of the present invention has a base insulating film interposed between the base 10 and the semiconductor layer 11, an insulating film provided between the adjacent to the layers 17 containing the organic compound, an insulating film covering the conductive layer 18 and a conductive layer 22 (refer to FIG. 1B).

In the above structure, the conductive layer 19 serving as an antenna corresponds to a conductive layer 20, a conductive layer 21, a conductive layer 27, or a conductive layer 28. The conductive layer 20 is provided in the same layer as the conductive layer 13, and the conductive layer 21 is provided in the same layer as the conductive layer 16. The conductive layer 27 is provided in the same layer as the conductive layer 25, and the conductive layer 28 is provided in the same layer as the conductive layer 18. In other words, the conductive layer 19 is provided in the same layer as the conductive layer 13, the conductive layer 16, the conductive layer 25, or the conductive layer 18. This characteristic can omit the independent step of forming the conductive layer 19 serving as an antenna and conduct the step of forming the conductive layer serving as an antenna at the same time as the step of forming a conductive layer of another element. Therefore, the manufacturing step can be simplified.

In the above structure, the storage element 23 corresponds to a laminated body including the conductive layer 25, the layer 17 containing an organic compound, and the conductive layer 26. Since the storage element 23 including a three-layer body has a simple structure, the storage element 23 can be easily manufactured; therefore, the manufacturing step can be simplified.

[Embodiment Mode 2]

Next, a structure of a semiconductor device of the present invention which is different from the above one will be described.

A semiconductor device of the present invention comprises, over a base (also referred to as a substrate) 30, a transistor 34 including a semiconductor layer 31, an insulating layer 32 serving as a gate insulating layer, and a conductive layer 33 serving as a gate electrode; an insulating layer 35 covering the transistor 34; a conductive layer 36 connected to an impurity region in the semiconductor layer 31 through an opening portion provided in the insulating layer 35; an insulating layer 37 covering the conductive layer 36; a layer 38 containing an organic compound connected to the conductive layer 36 through an opening portion provided in the insulating layer 37; a conductive layer 39 in contact with the layer 38 containing an organic compound; and a conductive layer 40 serving as an antenna (refer to FIG. 2A).

Moreover, the semiconductor device of the present invention has a base insulating film interposed between the base 30 and the semiconductor layer 31, an insulating film covering the conductive layer 39 and a conductive layer 43 (refer to FIG. 2A).

In the above structure, the conductive layer 40 serving as an antenna corresponds to a conductive layer 41, a conductive layer 42, or the conductive layer 43. The conductive layer 41 is provided in the same layer as the conductive layer 33, the conductive layer 42 is provided in the same layer as the conductive layer 36, and the conductive layer 43 is provided in the same layer as the conductive layer 39. In other words, the conductive layer 40 is provided in the same layer as the conductive layer 33, the conductive layer 36, or the conductive layer 39. This characteristic can omit the independent step of forming the conductive layer 40 serving as an antenna and conduct the step of forming the conductive layer serving as an antenna at the same time as the step of forming a conductive layer of another element. Therefore, the manufacturing step can be simplified.

In the above structure, a storage element 44 corresponds to a laminated body including the conductive layer 36, the layer 38 containing an organic compound, and the conductive layer 39. Since the storage element 44 including a three-layer body has a simple structure, the storage element 44 can be manufactured easily, which contributes to simplification of the manufacturing step.

Moreover in the above structure, the conductive layer 36 serves as a source wiring or a drain wiring of the transistor 34 and also serves as one conductive layer which constitutes a part of the storage element 44. In this way, since the conductive layer 36 has two functions, the manufacturing step can be simplified further. However, in some cases, data can be easily written in the storage element or data can be easily read from the storage element, if the conductive layer serving as the source wiring or the drain wiring of the transistor and the conductive layer constituting a part of the storage element are formed with different materials. In such cases, a conductive layer 29 is preferably provided as another conductive layer in the storage element (refer to FIG. 2C). Then, the conductive layer 16 serving as the source wiring or the drain wiring of the transistor 14 is preferably connected electrically to the conductive layer 29.

A peeling layer may be provided between the base 30 and an element group including the transistor 34. By using the peeling layer, the base 30 and the element group including the transistor 34 may be separated.

Next, a structure of a semiconductor device of the present invention which is different from the above one will be described.

A semiconductor device of the present invention comprises, over a base (also referred to as a substrate) 30, a transistor 34 including a semiconductor layer 31, an insulating layer 32 serving as a gate insulating layer, and a conductive layer 33 serving as a gate electrode; an insulating layer 35 covering the transistor 34; a conductive layer 36 connected to an impurity region in the semiconductor layer 31 through an opening portion provided in the insulating layer 35; an insulating layer 37 covering the conductive layer 36; a conductive layer 45 connected to the conductive layer 36 through an opening portion provided in the insulating layer 37; an insulating layer 46 covering the conductive layer 45; a layer 38 containing an organic compound connected to the conductive layer 45 through an opening portion provided in the insulating layer 46; a conductive layer 47 in contact with the layer 38 containing an organic compound; and a conductive layer 40 serving as an antenna (refer to FIG. 2B).

Moreover, the semiconductor device of the present invention has a base insulating film interposed between the base 30 and the semiconductor layer 31, an insulating film covering the conductive layer 47 and a conductive layer 49 (refer to FIG. 2B).

In the above structure, the conductive layer 40 serving as an antenna corresponds to a conductive layer 41, a conductive layer 42, a conductive layer 48, or the conductive layer 49. The conductive layer 41 is provided in the same layer as the conductive layer 33, and the conductive layer 42 is provided in the same layer as the conductive layer 36. The conductive layer 48 is provided in the same layer as the conductive layer 45, and the conductive layer 49 is provided in the same layer as the conductive layer 47. In other words, the conductive layer 40 is provided in the same layer as the conductive layer 41, the conductive layer 42, the conductive layer 48, or the conductive layer 49. This characteristic can omit the independent step of forming the conductive layer 40 serving as an antenna and conduct the step of forming the conductive layer serving as an antenna at the same time as the step of forming a conductive layer in another element, which can simplify the manufacturing step.

In the above structure, the storage element 44 corresponds to a laminated body including the conductive layer 45, the layer 38 containing an organic compound, and the conductive layer 47. Since the storage element 44 including a three-layer body has a simple structure, the storage element can be easily manufactured, which contributes to simplification of the manufacturing step.

In the structure described with reference to FIGS. 1A to 1C and FIGS. 2A to 2C, the conductive layer serving as an antenna may be provided not only in one layer but also in plural layers. For example, in the structure shown in FIG. 1A, plural layers selected from the conductive layer 20, the conductive layer 21, and the conductive layer 22 may be provided as the conductive layer 19 serving as an antenna. By providing the conductive layer serving as an antenna in plural layers, the receiving sensitivity of the semiconductor device can be improved. Moreover, in the structure described with reference to FIGS. 1A to 1C and FIGS. 2A to 2C, the transistor is a top-gate transistor. However, the present invention is not limited to the top-gate transistor and a bottom-gate transistor may be used.

It is preferable that the conductive layer serving as an antenna be low-resistant. To decrease the resistance, the conductive layer serving as an antenna is preferably formed to be thick. Therefore, the conductive layer serving as an antenna is preferably formed by a droplet-discharging method or a damascene method. The damascene method is a method in which a groove is formed in an insulating layer and a conductive layer is formed so as to fill the groove. According to the damascene method, the film thickness can be easily increased by adjusting the depth of the groove. As a conductive layer formed by the damascene method, a layer to which a gate electrode of a transistor is to be provided is preferred.

[Embodiment Mode 3]

A semiconductor device of the present invention comprises, over a base (also referred to as a substrate) 51, a conductive layer 52, a layer 53 containing an organic compound connected to the conductive layer 52, and a conductive layer 54 connected to the layer 53 containing an organic compound.

Moreover, the semiconductor device comprises, over a base 55, a transistor 59 including a semiconductor layer 56, an insulating layer 57 serving as a gate insulating layer, and a conductive layer 58 serving as a gate electrode; a insulating layer 60 covering the transistor 59; a conductive layer 61 connected to an impurity region in the semiconductor layer 56 through an opening portion provided in the insulating layer 60; and a conductive layer 62 serving as an antenna (refer to FIG. 3A).

Further, the semiconductor device has a base insulating film provided between the base 55 and the semiconductor layer 56, an insulating film covering conductive layers 61 and 64, an insulating film covering the conductive layer 54, and an insulating film provided between adjacent layers 53 containing an organic compound (refer to FIG. 3A). Opening portions are respectively provided in the insulating film covering the conductive layers 61 and 64 and the insulating film covering the conductive layer 54. A conductive particle 65 is provided inside the opening portion.

Moreover, in the above structure, the base 51 and the base 55 are pasted to each other through a layer 66 including the conductive particle 65 so that the conductive layer 52 is in contact with the conductive layer 61 or the conductive layer 54 is in contact with the conductive layer 61. In the shown structure, the base 51 and the base 55 are pasted to each other through the layer 66 including the conductive particle 65 so that the conductive layer 54 is in contact with the conductive layer 61.

In the above structure, the conductive layer 62 serving as an antenna corresponds to a conductive layer 63 or a conductive layer 64. The conductive layer 63 is provided in the same layer as the conductive layer 58, and the conductive layer 64 is provided in the same layer as the conductive layer 61. In other words, the conductive layer 62 is provided in the same layer as the conductive layer 58 or the conductive layer 61. This characteristic can omit the independent step of forming the conductive layer 62 serving as an antenna and conduct the step of forming the conductive layer serving as an antenna at the same time as the step of forming a conductive layer of another element. Therefore, the manufacturing step can be simplified.

In the above structure, a storage element 70 corresponds to a laminated body including the conductive layer 52, the layer 53 containing an organic compound, and the conductive layer 54.

A peeling layer may be provided between the base 55 and an element group including the transistor 59. By using the peeling layer, the base 55 and the element group including the transistor 59 may be separated. Alternatively, a peeling layer may be provided between the base 51 and an element group including the storage element 70. By using the peeling layer, the base 51 and the element group including the storage element 70 may be separated.

In the layer 66 including the conductive particle 65, a spacer may be provided. By providing the spacer, the distance between the base 51 and the base 55 can be controlled. Moreover, the conductive layer 52 and the conductive layer 61, or the conductive layer 54 and the conductive layer 61 are connected electrically to each other by the layer 66 including the conductive particle 65 (corresponding to the conductive particle 65 and a resin layer); however, the present invention is not limited to this mode. The conductive layer 52 and the conductive layer 61, or the conductive layer 54 and the conductive layer 61 may be electrically connected by using only a bump, by using a bump and a resin layer, or by using a bump, a conductive particle, and a resin layer.

Next, a structure of a semiconductor device of the present invention which is different from the above one will be described.

Figure 3B:
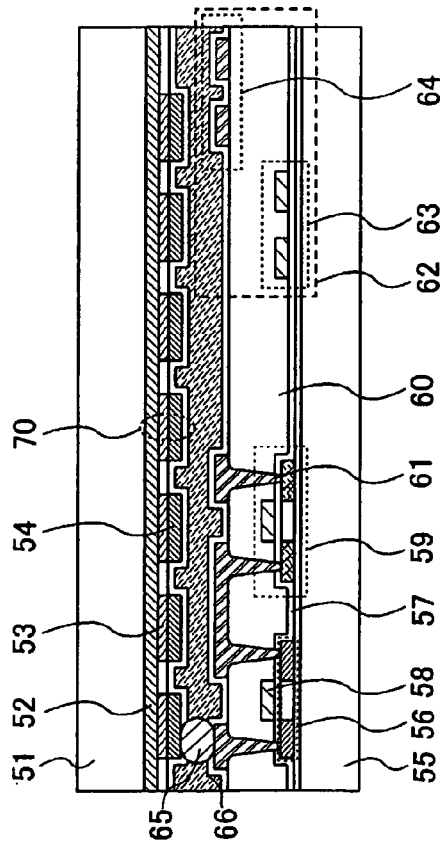

A semiconductor device of the present invention comprises, over a base (also referred to as a substrate) 51, a conductive layer 52, a layer 53 containing an organic compound connected to the conductive layer 52, and a conductive layer 54 connected to the layer 53 containing an organic compound (refer to FIG. 3B).

Moreover, the semiconductor device comprises, over a base 55, a transistor 59 including a semiconductor layer 56, an insulating layer 57, and a conductive layer 58; an insulating layer 60 covering the transistor 59; a conductive layer 61 connected to an impurity region in the semiconductor layer 56 through an opening portion provided in the insulating layer 60; an insulating layer 67 covering the conductive layer 61; a conductive layer 68 connected to the conductive layer 61 through an opening portion provided in the insulating layer 67; and a conductive layer 62 serving as an antenna (refer to FIG. 3B).

Further, the semiconductor device has a base insulating film provided between the base 55 and the semiconductor layer 56, an insulating film covering conductive layers 68 and 69, an insulating film covering the conductive layer 54, and an insulating film provided between adjacent layers 53 containing an organic compound (refer to FIG. 3B). Opening portions are respectively provided in the insulating film covering the conductive layers 68 and 69 and the insulating film covering the conductive layer 54. A conductive particle 65 is provided inside the opening portion.

In the above structure, the base 51 and the base 55 are pasted to each other through a layer 66 including the conductive particle 65 so that the conductive layer 52 is in contact with the conductive layer 68 or the conductive layer 54 is in contact with the conductive layer 68. In the shown structure, the base 51 and the base 55 are pasted to each other through the layer 66 including the conductive particle 65 so that the conductive layer 54 is in contact with the conductive layer 68.

In the above structure, the conductive layer 62 serving as an antenna corresponds to the conductive layer 63, the conductive layer 64, or the conductive layer 69. The conductive layer 63 is provided in the same layer as the conductive layer 58, the conductive layer 64 is provided in the same layer as the conductive layer 61, and the conductive layer 69 is provided in the same layer as the conductive layer 68. In other words, the conductive layer 62 is provided in the same layer as the conductive layer 63, the conductive layer 64, or the conductive layer 69. This characteristic can omit the independent step of forming the conductive layer 62 serving as an antenna, and conduct the step of forming the conductive layer serving as an antenna at the same time as the step of forming a conductive layer of another element. Therefore, the manufacturing step can be simplified.

In the above structure, the storage element 70 corresponds to a laminated body including the conductive layer 52, the layer 53 containing an organic compound, and the conductive layer 54.

[Embodiment Mode 4]

A structure of a semiconductor device of the present invention which is different from the above one will be described.

A semiconductor device of the present invention comprises, over a base (also referred to as a substrate) 71, a transistor 75 including a semiconductor layer 72, an insulating layer 73 serving as a gate insulating layer, and a conductive layer 74 serving as a gate electrode; an insulating layer 76 covering the transistor 75; a conductive layer 77 connected to an impurity region in the semiconductor layer 72 through an opening portion provided in the insulating layer 76; an insulating layer 78 covering an end portion of the conductive layer 77; a layer 79 containing an organic compound connected to the conductive layer 77 through an opening portion provided in the insulating layer 78; a conductive layer 81 connected to the conductive layer 77 through an opening portion provided in the insulating layer 78; and a conductive layer 80 connected to the layer 79 containing an organic compound through an opening portion provided in the insulating layer 78 (refer to FIG. 4A).

Over a base (also referred to as a substrate) 55, a transistor 59 including a semiconductor layer 56, an insulating layer 57 serving as a gate insulating layer, and a conductive layer 58 serving as a gate electrode; an insulating layer 60 covering the transistor 59; a conductive layer 61 connected to an impurity region in the semiconductor layer 56 through an opening portion provided in the insulating layer 60; and a conductive layer 62 serving as an antenna are provided (refer to FIG. 4A).

Further, the semiconductor device has an insulating film provided between the base 55 and the semiconductor layer 56, an insulating film covering conductive layers 61 and 64, a base insulating film provided between the base 71 and the semiconductor layer 72, an insulating film covering the conductive layer 80 and the conductive layer 81 (refer to FIG. 4A). Opening portions are respectively provided in the insulating film covering the conductive layers 61 and 64 and the insulating film covering the conductive layer 80 and the conductive layer 81. A conductive particle 65 is provided inside the opening portion.

In the above structure, the base 71 and the base 55 are pasted to each other through a layer 66 including the conductive particle 65 so that the conductive layer 81 is in contact with the conductive layer 61.

In the above structure, the conductive layer 62 serving as an antenna corresponds to the conductive layer 63 or the conductive layer 64. The conductive layer 63 is provided in the same layer as the conductive layer 58, and the conductive layer 64 is provided in the same layer as the conductive layer 61. In other words, the conductive layer 62 is provided in the same layer as the conductive layer 58 or the conductive layer 61. This characteristic can omit the independent step of forming the conductive layer 62 serving as an antenna, and conduct the step of forming the conductive layer serving as an antenna at the same time as the step of forming a conductive layer of another element. Therefore, the manufacturing step can be simplified.

In the above structure, a storage element 82 corresponds to a laminated body including the conductive layer 77, the layer 79 containing an organic compound, and the conductive layer 80. The storage element 82 is controlled by the transistor 75.

A peeling layer may be provided between the base 55 and an element group including the transistor 59. Then, by using the peeling layer, the base 55 and the element group including the transistor 59 may be separated. Alternatively, a peeling layer may be provided between the base 71 and an element group including the transistor 75 and the storage element 82.

By using the peeling layer, the base 71 and the element group including the transistor 75 and the storage element 82 may be separated.

In the layer 66 including the conductive particle 65, a spacer may be provided. By providing the spacer, the distance between the base 71 and the base 55 can be controlled. Moreover, the conductive layer 81 and the conductive layer 61 are electrically connected to each other by the layer 66 including the conductive particle 65 (corresponding to the conductive particle 65 and a resin layer); however, the present invention is not limited to this mode. The conductive layer 81 and the conductive layer 61 may be electrically connected by using only a bump, by using a bump and a resin layer, or by using a bump, a conductive particle, and a resin layer.

Next, a structure of a semiconductor device of the present invention which is different from the above one will be described.

A semiconductor device of the present invention comprises, over a base (also referred to as a substrate) 71, a transistor 75 including a semiconductor layer 72, an insulating layer 73 serving as a gate insulating layer, and a conductive layer 74 serving as a gate electrode; an insulating layer 76 covering the transistor 75; a conductive layer 77 connected to an impurity region in the semiconductor layer 72 through an opening portion provided in the insulating layer 76; an insulating layer 78 covering an end portion of the conductive layer 77; a layer 79 containing an organic compound connected to the conductive layer 77 through an opening portion provided in the insulating layer 78; a conductive layer 81 connected to the conductive layer 77 through an opening portion provided in the insulating layer 78; and a conductive layer 80 connected to the layer 79 containing an organic compound through an opening portion provided in the insulating layer 78 (refer to FIG. 4B).

The semiconductor device comprises, over a base (also referred to as a substrate) 55, a transistor 59 including a semiconductor layer 56, an insulating layer 57, and a conductive layer 58; an insulating layer 60 covering the transistor 59; a conductive layer 61 connected to an impurity region in the semiconductor layer 56 through an opening portion provided in the insulating layer 60; an insulating layer 67 covering the conductive layer 61; a conductive layer 68 connected to the conductive layer 61 through an opening portion provided in the insulating layer 67; and a conductive layer 62 serving as an antenna (refer to FIG. 4B).

Further, the semiconductor device has an insulating film provided between the base 55 and the semiconductor layer 56, an insulating film covering conductive layers 68 and 69, a base insulating film provided between the base 71 and the semiconductor layer 72, an insulating film covering the conductive layer 80 and the conductive layer 81 (refer to FIG. 4B). Opening portions are respectively provided in the insulating film covering the conductive layers 68 and 69 and the insulating film covering the conductive layer 80 and the conductive layer 81. A conductive particle 65 is provided inside the opening portion.

In the above structure, the base 71 and the base 55 are pasted to each other through a layer 66 including a conductive particle 65 so that the conductive layer 81 is in contact with the conductive layer 68.

In the above structure, the conductive layer 62 serving as an antenna corresponds to the conductive layer 63, the conductive layer 64, or the conductive layer 69. The conductive layer 63 is provided in the same layer as the conductive layer 58, the conductive layer 64 is provided in the same layer as the conductive layer 61, and the conductive layer 69 is provided in the same layer as the conductive layer 68. In other words, the conductive layer 62 is provided in the same layer as the conductive layer 63, the conductive layer 64, or the conductive layer 69. This characteristic can omit the independent step of forming the conductive layer 62 serving as an antenna and conduct the step of forming the conductive layer serving as an antenna at the same time as the step of forming a conductive layer of another element. Therefore, the manufacturing step can be simplified.

In the above structure, the storage element 82 corresponds to a laminated body including the conductive layer 77, the layer 79 containing an organic compound, and the conductive layer 80. The storage element 82 is controlled by the transistor 75.

[Embodiment Mode 5]

Next, a structure of a semiconductor device of the present invention which is different from the above one will be described.

Figure 5:
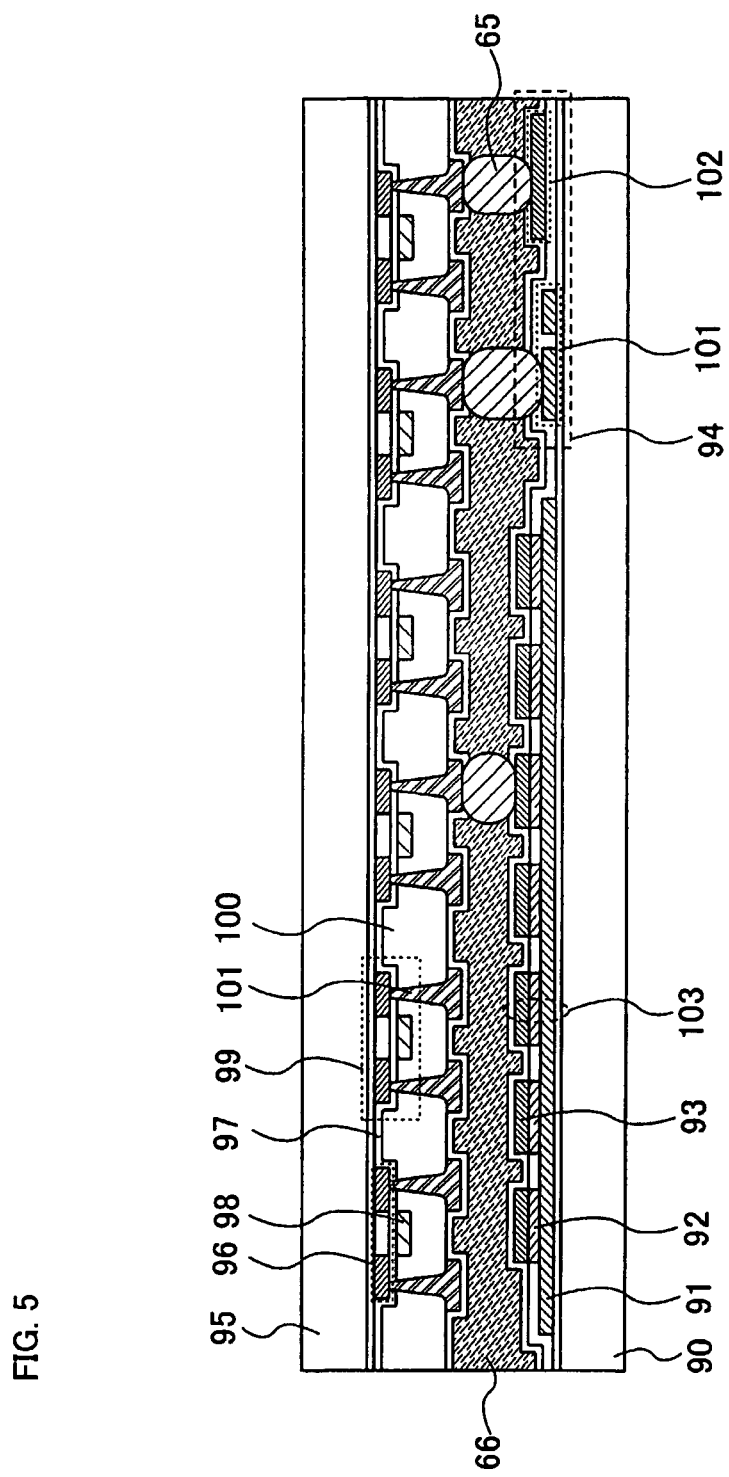
FIG. 5 shows a semiconductor device of the present invention.

A semiconductor device of the present invention comprises, over a base (also referred to as a substrate) 90, a conductive layer 91, a layer 92 containing an organic compound connected to the conductive layer 91, a conductive layer 93 connected to the layer 92 containing an organic compound, and a conductive layer 94 serving as an antenna (refer to FIG. 5).

The semiconductor device of the present invention comprises, over a base 95, a transistor 99 including a semiconductor layer 96, an insulating layer 97 serving as a gate insulating layer, and a conductive layer 98 serving as a gate electrode; an insulating layer 100 covering the transistor 99; and a conductive layer 101 connected to an impurity region in the semiconductor layer 96 through an opening portion provided in the insulating layer 100 (refer to FIG. 5).

Further, the semiconductor device has an insulating film provided between the base 90 and the conductive layer 91, an insulating layer covering the conductive layer 101, an insulating film covering conductive layers 93 and 102, a base insulating film provided between the base 95 and the semiconductor layer 96 (refer to FIG. 5). Opening portions are respectively provided in the insulating film covering the conductive layers 93 and 102 and the insulating film covering the conductive layer 101. A conductive particle 65 is provided inside the opening portion.

In the above structure, the base 90 and the base 95 are pasted to each other through a layer 66 including a conductive particle 65 so that the conductive layer 91 is in contact with the conductive layer 101 or the conductive layer 93 is in contact with the conductive layer 101. The drawing shows a structure in which the conductive layer 91 and the conductive layer 101, and the conductive layer 93 and the conductive layer 101 are both in contact with each other. However, actually, the conductive layer 91 and the conductive layer 101, or the conductive layer 93 and the conductive layer 101 are in contact with each other.

In the above structure, the conductive layer 94 serving as an antenna corresponds to the conductive layer 101 or the conductive layer 102. The conductive layer 101 is provided in the same layer as the conductive layer 91, and the conductive layer 102 is provided in the same layer as the conductive layer 93. In other words, the conductive layer 94 is provided in the same layer as the conductive layer 91 or the conductive layer 93. This characteristic can omit the independent step of forming the conductive layer serving as an antenna and conduct the step of forming the conductive layer serving as an antenna at the same time as the step of forming a conductive layer of another element. Therefore, the manufacturing step can be simplified.

In the above structure, the storage element 103 corresponds to a laminated body including the conductive layer 91, the layer 92 containing an organic compound, and the conductive layer 93.

In the structure described with reference to FIGS. 3A and 3B, FIGS. 4A and 4B, and FIG. 5, the conductive layer serving as an antenna may be provided not only in one layer but also in plural layers. By providing the conductive layer serving as an antenna in plural layers, the receiving sensitivity of the semiconductor device can be improved. Moreover, in the structure described with reference to FIGS. 3A and 3B, FIGS. 4A and 4B, and FIG. 5, the transistor is a top-gate transistor. However, the present invention is not limited to the top-gate transistor. A bottom-gate transistor may also be employed.

It is preferable that the conductive layer serving as an antenna be low-resistant. To decrease the resistance, the conductive layer serving as an antenna is preferably formed to be thick. Therefore, the conductive layer serving as an antenna is preferably formed by a droplet-discharging method or a damascene method. The damascene method is a method in which a groove is formed in an insulating layer and a conductive layer is formed so as to fill the groove. According to the damascene method, the film thickness can be easily increased by adjusting the depth of the groove. As a conductive layer formed by the damascene method, a layer to which a gate electrode of a transistor is to be provided is preferred.

A peeling layer may be provided between the base 90 and an element group including the storage element 103. By using the peeling layer, the base 90 and the element group including the storage element 103 may be separated. Alternatively, a peeling layer may be provided between the base 95 and an element group including the transistor 99. By using the peeling layer, the base 95 and the element group including the transistor 99 may be separated.

In the layer 66 including the conductive particle 65, a spacer may be provided. By providing the spacer, the distance between the base 90 and the base 95 can be controlled. Moreover, the conductive layer 101 and the conductive layer 93 are connected electrically to each other by the layer 66 including the conductive particle 65 (corresponding to the conductive particle 65 and a resin layer); however, the present invention is not limited to this mode. The conductive layer 81 and the conductive layer 61 may be electrically connected by using only a bump, by using a bump and a resin layer, or by using a bump, a conductive particle, and a resin layer.

[Embodiment Mode 6]

Figure 6A:
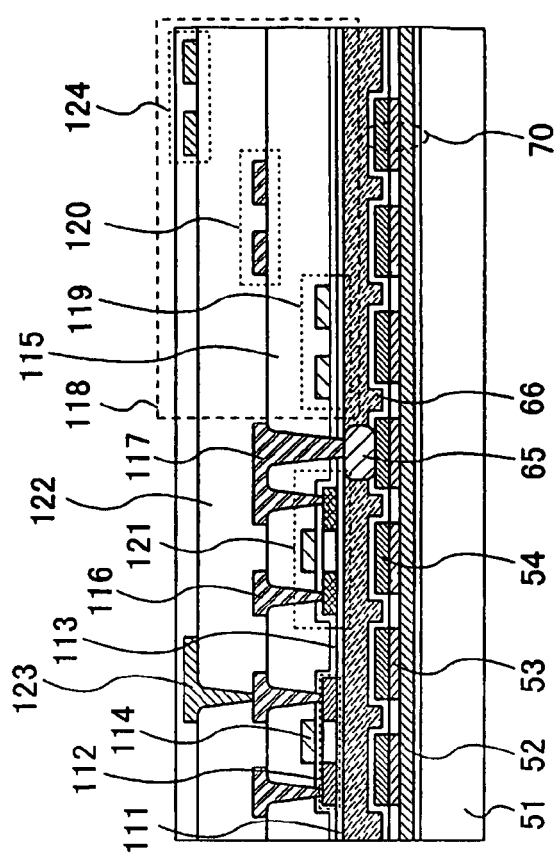
FIGS. 6A and 6B show a semiconductor device of the present invention.

A semiconductor device of the present invention comprises, over a base 51, a conductive layer 52; a layer 53 containing an organic compound connected to the conductive layer 52; a conductive layer 54 connected to the layer 53 containing an organic compound; a layer 66 including a conductive particle 65 over the conductive layer 54; an insulating layer 111 covering the layer 66 including the conductive particle 65; a semiconductor layer 112 over the insulating layer 111; an insulating layer 113 serving as a gate insulating layer; a conductive layer 114 serving as a gate electrode; an insulating layer 115 covering the conductive layer 114; a conductive layer 116 connected to an impurity region in the semiconductor layer 112 through an opening portion provided in the insulating layer 115; a conductive layer 117 connected to the layer 66 including the conductive particle 65 through an opening portion provided in the insulating layer 111 and an opening portion provided in the insulating layer 115; and a conductive layer 118 serving as an antenna (refer to FIG. 6A).

Further, the semiconductor device has a base insulating film provided between the base 51 and the conductive layer 52, an insulating film provided between the adjacent layers 53 containing the organic compound, an insulating film covering the conductive layer 54, an insulating film covering the conductive layer 116 and the conductive layer 117 and the conductive layer 120 (refer to FIG. 6A). An opening portions is provided in the insulating film covering the conductive layer 54. The conductive particle 65 is provided inside the opening portion.

In the above structure, the conductive layer 118 serving as an antenna corresponds to the conductive layer 119 or the conductive layer 120. The conductive layer 119 is provided in the same layer as the conductive layer 114, and the conductive layer 120 is provided in the same layer as the conductive layer 116. In other words, the conductive layer 118 is provided in the same layer as the conductive layer 114 or the conductive layer 116. This characteristic can omit the independent step of forming the conductive layer serving as an antenna and conduct the step of forming the conductive layer serving as an antenna at the same time as the step of forming a conductive layer of another element. Therefore, the manufacturing step can be simplified.

In the above structure, the semiconductor layer 112, the insulating layer 113, and the conductive layer 114 serve as a transistor 121. A laminated body including the conductive layer 52, the layer 53 containing an organic compound, and the conductive layer 54 serves as a storage element 70.

In the above structure, the conductive layer 116 and the conductive layer 117 are manufactured in the same step. However, the conductive layer 116 and the conductive layer 117 fill different opening portions. One of the conductive layer 116 and the conductive layer 117 is connected to an impurity region in the semiconductor layer 112 and the other is connected to the layer 66 including the conductive particle 65. The conductive layer 117 is formed so that the surface thereof is exposed when peeling plural elements including the transistor 121 from the substrate. Then, plural elements and the substrate where the storage element 70 is provided are pasted to each other through the layer 66 including the conductive particle 65 so that the storage element 70 and the conductive layer 117 are electrically connected to each other.

A peeling layer may be provided between the base 51 and an element group including the storage element 70. By using the peeling layer, the base 51 and the element group including the storage element 70 may be separated.

In the layer 66 including the conductive particle 65, a spacer may be provided. Moreover, the conductive layer 54 and the conductive layer 117 are connected electrically to each other by the layer 66 including the conductive particle 65 (corresponding to the conductive particle 65 and a resin layer); however, the present invention is not limited to this mode. The storage element 70 and the conductive layer 117 may be electrically connected by using only a bump, by using a bump and a resin layer, or by using a bump, a conductive particle, and a resin layer.

Figure 6B:
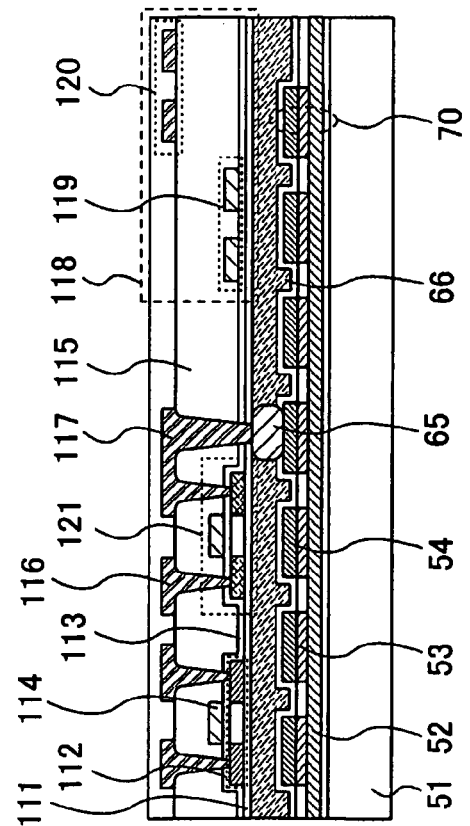

A semiconductor device of the present invention comprises, over a base 51, a conductive layer 52; a layer 53 containing an organic compound connected to the conductive layer 52; a conductive layer 54 connected to the layer 53 containing an organic compound; a layer 66 including a conductive particle 65 over the conductive layer 54; an insulating layer 111 covering the layer 66 including the conductive particle 65; a semiconductor layer 112 over the insulating layer 111; an insulating layer 113 serving as a gate insulating layer; a conductive layer 114 serving as a gate electrode; an insulating layer 115 covering the conductive layer 114; a conductive layer 116 connected to the semiconductor layer 112 through an opening portion provided in the insulating layer 115; a conductive layer 117 connected to the layer 66 including the conductive particle 65 through an opening portion provided in the insulating layer 111 and an opening portion provided in the insulating layer 115; an insulating layer 122 covering the conductive layer 116 and the conductive layer 117; a conductive layer 123 connected to the conductive layer 116 through an opening portion provided in the insulating layer 122; and a conductive layer 118 serving as an antenna (refer to FIG. 6B).

Further, the semiconductor device has a base insulating film provided between the base 51 and the conductive layer 52, an insulating film provided between the adjacent layers 53 containing the organic compound, an insulating film covering the conductive layer 54, an insulating film covering the conductive layer 123 and the conductive layer 124 (refer to FIG. 6B). An opening portion is provided in the insulating film covering the conductive layer 54. The conductive particle 65 is provided inside the opening portion.

In the above structure, the conductive layer 118 serving as an antenna corresponds to the conductive layer 119, the conductive layer 120, or the conductive layer 124. The conductive layer 119 is provided in the same layer as the conductive layer 114, the conductive layer 120 is provided in the same layer as the conductive layer 116, and the conductive layer 124 is provided in the same layer as the conductor layer 123. In other words, the conductive layer 118 is provided in the same layer as the conductive layer 114, the conductive layer 116, or the conductive layer 124. This characteristic can omit the independent step of forming the conductive layer 118 serving as an antenna and conduct the step of forming the conductive layer serving as an antenna at the same time as the step of forming a conductive layer of another element. Therefore, the manufacturing step can be simplified.

In the above structure, the semiconductor layer 112, the insulating layer 113, and the conductive layer 114 serve as the transistor 121. A laminated body including the conductive layer 52, the layer 53 containing an organic compound, and the conductive layer 54 serves as the storage element 70.

[Embodiment Mode 7]

Figure 7A:
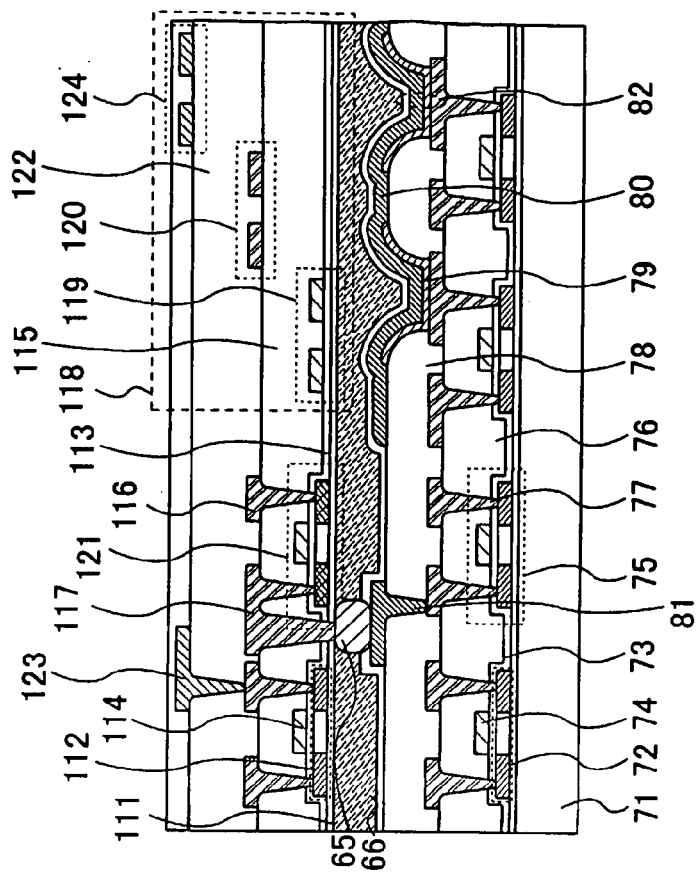
FIGS. 7A and 7B show a semiconductor device of the present invention.

A semiconductor device of the present invention comprises, over a base 71, a transistor 75 including a semiconductor layer 72, an insulating layer 73 serving as a gate insulating layer, and a conductive layer 74 serving as a gate electrode; an insulating layer 76 covering the transistor 75; a conductive layer 77 connected to an impurity region in the semiconductor layer 72 through an opening portion provided in the insulating layer 76; an insulating layer 78 covering the conductive layer 77; a conductive layer 81 connected to the conductive layer 77 through an opening portion provided in the insulating layer 78; a layer 79 containing an organic compound; a conductive layer 80 connected to the layer 79 containing an organic compound; a layer 66 including a conductive particle 65 over the conductive layer 80; an insulating layer 111 over the layer 66 including the conductive particle 65; a semiconductor layer 112 over the insulating layer 111; an insulating layer 113 serving as a gate insulating layer; a conductive layer 114 serving as a gate electrode; an insulating layer 115 covering the conductive layer 114; a conductive layer 116 connected to the semiconductor layer 112 through an opening portion provided in the insulating layer 115; a conductive layer 117 connected to the layer 66 including the conductive particle 65 through an opening portion provided in the insulating layer 111 and an opening portion provided in the insulating layer 115; and a conductive layer 118 serving as an antenna (refer to FIG. 7A).

Further, the semiconductor device has a base insulating film provided between the base 71 and the semiconductor layer 72, an insulating film covering conductive layers 80 and 81, an insulating film covering the conductive layer 116 and the conductive layer 117 and the conductive layer 120 (refer to FIG. 7A). Opening portions are respectively provided in the insulating film covering the conductive layers 80 and 81. The conductive particle 65 is provided inside the opening portion.

In the above structure, the conductive layer 118 serving as an antenna corresponds to the conductive layer 119 or the conductive layer 120. The conductive layer 119 is provided in the same layer as the conductive layer 114, and the conductive layer 120 is provided in the same layer as the conductive layer 116. In other words, the conductive layer 118 is provided in the same layer as the conductive layer 114 or the conductive layer 116. This characteristic can omit the independent step of forming the conductive layer 118 serving as an antenna and conduct the step of forming the conductive layer serving as an antenna at the same time as the step of forming a conductive layer of another element. Therefore, the manufacturing step can be simplified.

In the above structure, the semiconductor layer 112, the insulating layer 113, and the conductive layer 114 serve as a transistor 121. A laminated body including the conductive layer 77, the layer 79 containing an organic compound, and the conductive layer 80 serves as a storage element 82. The storage element 82 is controlled by the transistor 75.

In the layer 66 including the conductive particle 65, a spacer may be provided. Moreover, the conductive layer 81 and the conductive layer 117 are connected electrically to each other by the layer 66 including the conductive particle 65 (corresponding to the conductive particle 65 and a resin layer); however, the present invention is not limited to this mode. The conductive layer 81 and the conductive layer 117 may be electrically connected by using only a bump, by using a bump and a resin layer, or by using a bump, a conductive particle, and a resin layer.

A semiconductor device of the present invention comprises, over a base 71, a transistor 75 including a semiconductor layer 72, an insulating layer 73 serving as a gate insulating layer, and a conductive layer 74 serving as a gate electrode; an insulating layer 76 covering the transistor 75; a conductive layer 77 connected to an impurity region in the semiconductor layer 72 through an opening portion provided in the insulating layer 76; an insulating layer 78 covering an end portion of the conductive layer 77; a conductive layer 81 connected to the conductive layer 77 through an opening portion provided in the insulating layer 78; a layer 79 containing an organic compound connected to the conductive layer 77 through an opening portion provided in the insulating layer 78; a conductive layer 80 connected to the layer 79 containing an organic compound; a layer 66 including a conductive particle 65 over the conductive layer 80; an insulating layer 111 over the layer 66 including the conductive particle 65; a semiconductor layer 112 over the insulating layer 111; an insulating layer 113 serving as a gate insulating layer; a conductive layer 114 serving as a gate electrode; an insulating layer 115 covering the conductive layer 114; a conductive layer 116 connected to the semiconductor layer 112 through an opening portion provided in the insulating layer 115; a conductive layer 117 connected to the layer 66 including the conductive particle 65 through an opening portion provided in the insulating layer 111 and an opening portion provided in the insulating layer 115; an insulating layer 122 covering the conductive layer 116 and the conductive layer 117; a conductive layer 123 connected to the conductive layer 116 through an opening portion provided in the insulating layer 122; and a conductive layer 118 serving as an antenna.

Figure 7B:
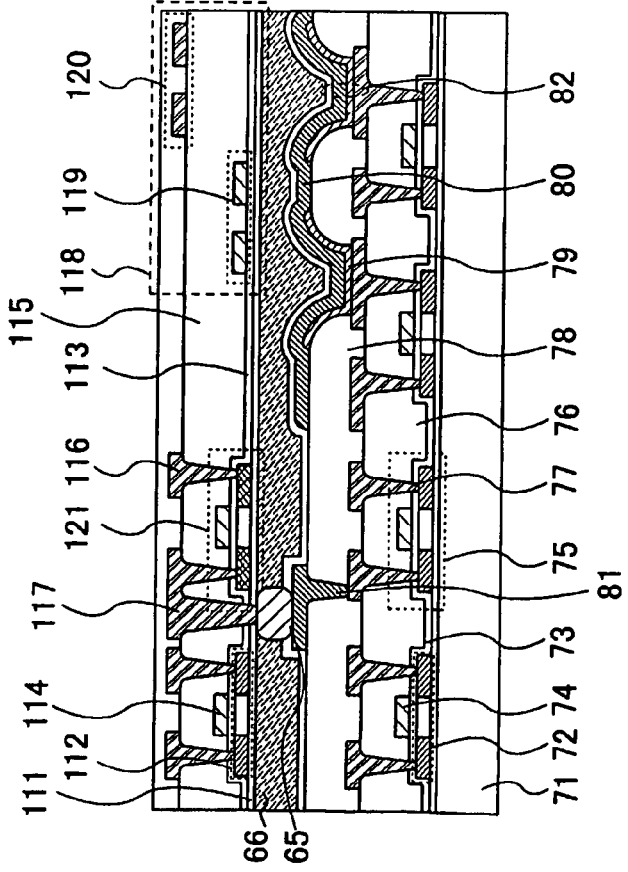

Further, the semiconductor device has a base insulating film provided between the base 71 and the semiconductor layer 72, an insulating film covering conductive layers 80 and 81, an insulating film covering the conductive layers 123 and 124 (refer to FIG. 7B). Opening portions are respectively provided in the insulating film covering the conductive layers 80 and 81. The conductive particle 65 is provided inside the opening portion.

In the above structure, the conductive layer 118 serving as an antenna corresponds to the conductive layer 119, the conductive layer 120, or the conductive layer 124. The conductive layer 119 is provided in the same layer as the conductive layer 114, the conductive layer 120 is provided in the same layer as the conductive layer 116, and the conductive layer 124 is provided in the same layer as the conductive layer 123. In other words, the conductive layer 118 is provided in the same layer as the conductive layer 114, the conductive layer 116, or the conductive layer 123. This characteristic can omit the independent step of forming the conductive layer 118 serving as an antenna and conduct the step of forming the conductive layer serving as an antenna at the same time as the step of forming a conductive layer of another element. Therefore, the manufacturing step can be simplified.

In the above structure, the semiconductor layer 112, the insulating layer 113, and the conductive layer 114 serve as the transistor 121. A laminated body including the conductive layer 77, the layer 79 containing an organic compound, and the conductive layer 80 serves as the storage element 82. The storage element 82 is controlled by the transistor 75.

[Embodiment Mode 8]

A semiconductor device of the present invention comprises, over a base 90, a conductive layer 91; a layer 92 containing an organic compound connected to the conductive layer 91; a conductive layer 93 connected to the layer 92 containing an organic compound; a conductive layer 94 serving as antenna; a layer 66 including a conductive particle 65 over the conductive layer 94; an insulating layer 131 over the layer 66 including the conductive particle 65; a semiconductor layer 132 over the insulating layer 131; an insulating layer 133 serving as a gate insulating layer; a conductive layer 134 serving as a gate electrode; an insulating layer 135 covering the conductive layer 134; a conductive layer 136 connected to the semiconductor layer 132 through an opening portion provided in the insulating layer 135; and a conductive layer 137 connected to the layer 66 including the conductive particle 65 through an opening portion provided in the insulating layer 131 and an opening portion provided in the insulating layer 135.

Figure 8:
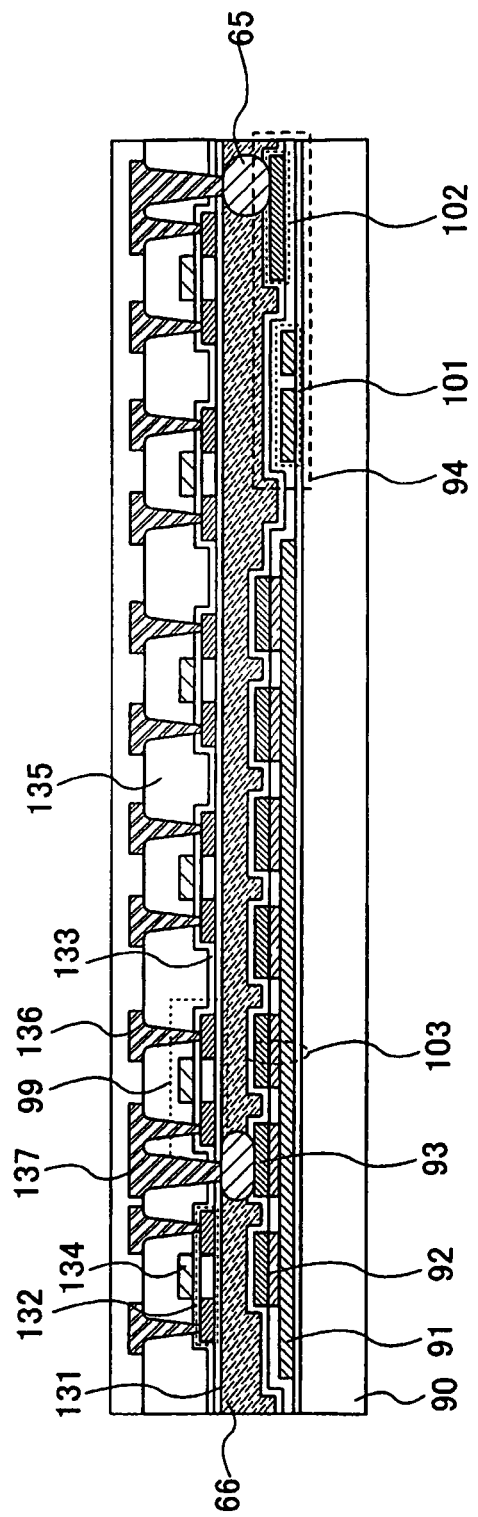
FIG. 8 shows a semiconductor device of the present invention.

Further, the semiconductor device has a base insulating film provided between the base 90 and the conductive layer 91, an insulating film covering conductive layer 101, an insulating film covering the conductive layer 93, an insulating film covering the conductive layers 136 and 137 (refer to FIG. 8). An opening portion is provided in the insulating film covering the conductive layer 93. The conductive particle 65 is provided inside the opening portion.

In the above structure, the conductive layer 94 serving as an antenna corresponds to the conductive layer 101 or the conductive layer 102. The conductive layer 101 is provided in the same layer as the conductive layer 91, and the conductive layer 102 is provided in the same layer as the conductive layer 93. In other words, the conductive layer 94 is provided in the same layer as the conductive layer 91 or the conductive layer 93. This characteristic can omit the independent step of forming the conductive layer 94 serving as an antenna and conduct the step of forming the conductive layer 94 serving as an antenna at the same time as the step of forming a conductive layer of another element. Therefore, the manufacturing step can be simplified.

In the above structure, the semiconductor layer 132, the insulating layer 133, and the conductive layer 134 serve as a transistor 99. A laminated body including the conductive layer 91, the layer 92 containing an organic compound, and the conductive layer 93 serves as a storage element 103.

In the structure described with reference to FIG. 6, FIGS. 7A and 7B, and FIG. 8, the conductive layer serving as an antenna may be provided not only in one layer but also in plural layers. By providing the conductive layer serving as an antenna in plural layers, the receiving sensitivity of the semiconductor device can be improved. Moreover, in the structure shown with reference to FIG. 6, FIGS. 7A and 7B, and FIG. 8, the transistor is a top-gate transistor. However, the present invention is not limited to this, and the transistor may be a bottom-gate transistor.

It is preferable that the conductive layer serving as an antenna be low-resistant. To decrease the resistance, the conductive layer serving as an antenna is preferably formed to be thick. Therefore, the conductive layer serving as an antenna is preferably formed by a droplet-discharging method or a damascene method. The damascene method is a method in which a groove is formed in an insulating layer and a conductive layer is formed so as to fill the groove. According to the damascene method, the film thickness can be easily increased by adjusting the depth of the groove. As a conductive layer formed by the damascene method, a layer to which a gate electrode of a transistor is to be provided is preferred.

A peeling layer may be provided between the base 90 and an element group including the storage element 103. By using the peeling layer, the base 90 and the element group including the storage element 103 may be separated.

In the layer 66 including the conductive particle 65, a spacer may be provided. Moreover, the conductive layer 93 and the conductive layer 137 are connected electrically to each other by the layer 66 including the conductive particle 65 (corresponding to the conductive particle 65 and a resin layer); however, the present invention is not limited to this mode. The conductive layer 93 and the conductive layer 137 may be electrically connected by using only a bump, by using a bump and a resin layer, or by using a bump, a conductive particle, and a resin layer.

[Embodiment Mode 9]

A method for manufacturing a semiconductor device of the present invention will be described with reference to FIGS. 12A to 12D.

Figure 12A:
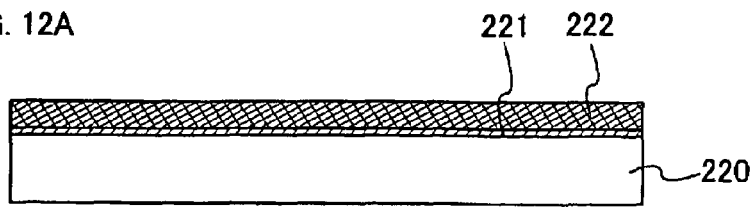
FIGS. 12A to 12D show a semiconductor device of the present invention.

First, a peeling layer 221 and a layer 22 including plural thin film integrated circuits are stacked over a substrate 220 (refer to FIG. 12A). The layer 222 including plural thin film integrated circuits has plural thin film integrated circuits each including three of a transistor, a storage element, and a conductive layer serving as an antenna. As a structure in which the three of a transistor, a storage element, and a conductive layer serving as an antenna are provided over a substrate, for example, structures shown in FIGS. 1A to 1C and FIGS. 2A to 2B are given.

Figure 12B:
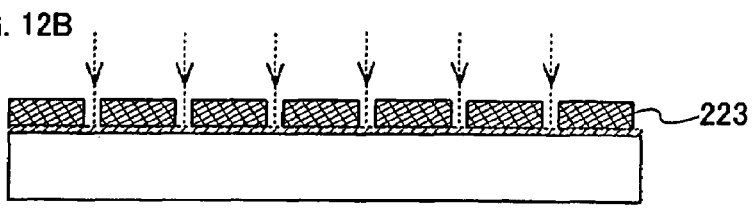

Next, an opening portion is formed selectively in the layer 222 including plural thin film integrated circuits, thereby exposing the peeling layer 221 (refer to FIG. 12B). Subsequently, etchant is introduced into the opening portion to remove the peeling layer 221. As the etchant, known etchant may be used, and for example liquid or gas including halogen fluoride, specifically chloride trifluoride ($ClF_3$), is preferably used.

Figure 12C:
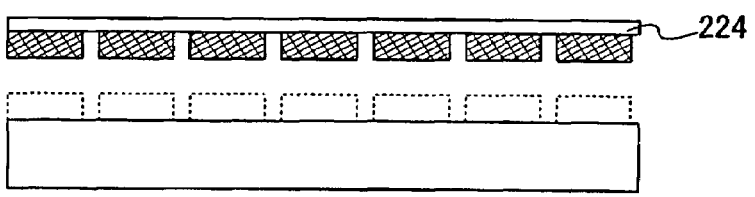
Figure 12D:
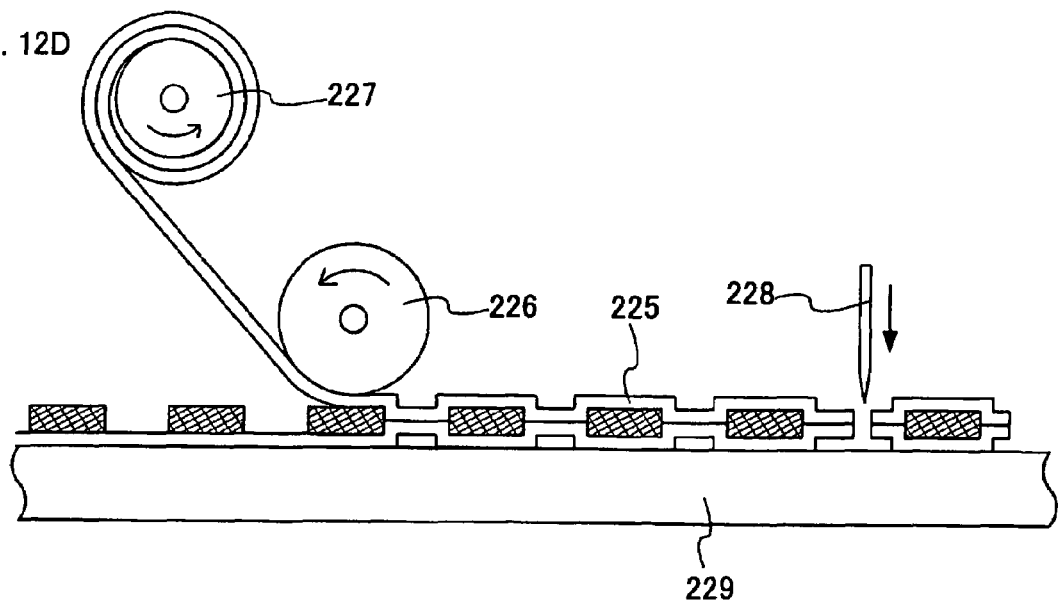

Next, one plane of a thin film integrated circuit 223 is attached to a base 224, and then the thin film integrated circuit 223 is peeled from the substrate 220 (refer to FIG. 12C). Then, the other plane of the thin film integrated circuit 223 is attached to a base 225, and the thin film integrated circuit 223 is sealed by the base 224 and the base 225 (refer to FIG. 12D). The thin film integrated circuit 223 sealed by the base 224 and the base 225 can be formed sequentially by using a seal roll 226 for conducting one or both of heating and pressuring, a supply roll 227 with the base 225 twining therearound, and a belt conveyer 229.

Next, the base 224 and the base 225 are cut by a cutting means 228. Then, the thin film integrated circuit 223 sealed by the base 224 and the base 225 is completed. A semiconductor device of the present invention includes in its category the thin film integrated circuit 223 sealed by the base 224 and the base 225.

The cutting means 228 corresponds to a dicer, a laser, a wire saw, a cutter, a knife, or the like.

A method for manufacturing a semiconductor device which is different from the above one will be described with reference to FIGS. 13A to 13E. In the method for forming a semiconductor device described hereinafter, at least two substrates are used. Over one substrate, a first thin film integrated circuit is provided, and over the other substrate, a second thin film integrated circuit is provided. Then, the first thin film integrated circuit and the second thin film integrated circuit are pasted to each other so that they are electrically connected. Thus, a thin film integrated circuit including a transistor, a storage element, and a conductive layer serving as an antenna is completed. As the structure in which the first thin film integrated circuit and the second thin film integrated circuit are electrically connected, for example, structures shown in FIGS. 3A and 3B, FIGS. 4A and 4B, and FIG. 5 are given.

Figure 13A:
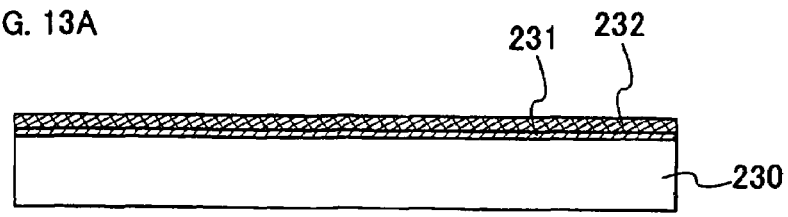
FIGS. 13A to 13E show a semiconductor device of the present invention.

Over a substrate 230, a peeling layer 231 and a layer 232 including a plurality of first thin film integrated circuits are stacked (refer to FIG. 13A). The layer 232 including the plurality of first thin film integrated circuits includes at least one or two selected from a transistor, a storage element, and a conductive layer serving as an antenna.

Figure 13B:
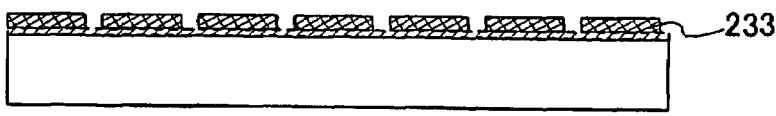

Next, an opening portion is formed selectively in the layer 232 including the plurality of first thin film integrated circuits, thereby exposing the peeling layer 231 (refer to FIG. 13B). Subsequently, etchant is introduced into the opening portion to remove the peeling layer 231. Subsequently, one plane of the first thin film integrated circuit 233 is attached to a base 234 and the thin film integrated circuit 233 is peeled from the substrate 230 (refer to FIG. 13C). Then, the base 234 with the first thin film integrated circuit 233 attached thereto is completed.

Next, by conducting the same step as the above one, a base 235 with the second thin film integrated circuit 236 attached thereto is formed. The second thin film integrated circuit 236 includes at least one or two selected from a transistor, a storage element, and a conductive layer serving as an antenna.

Moreover, a layer 237 including a conductive particle is provided so as to overlap with the first thin film integrated circuit 233 or the second thin film integrated circuit 236. Here, the conductive layer 237 including a conductive particle is formed so as to overlap the second thin film integrated circuit 236.

Figure 13C:
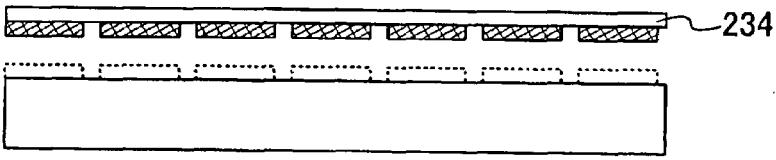
Figure 13D:
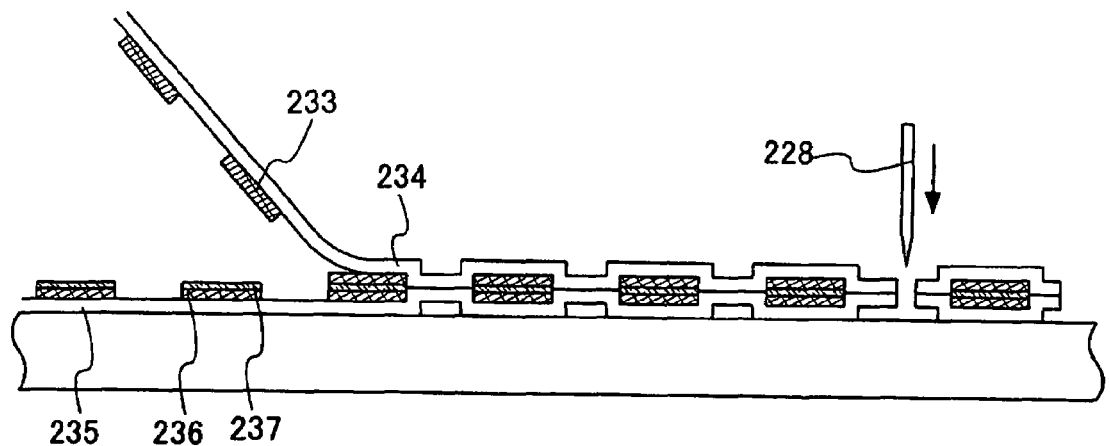
Figure 13E:
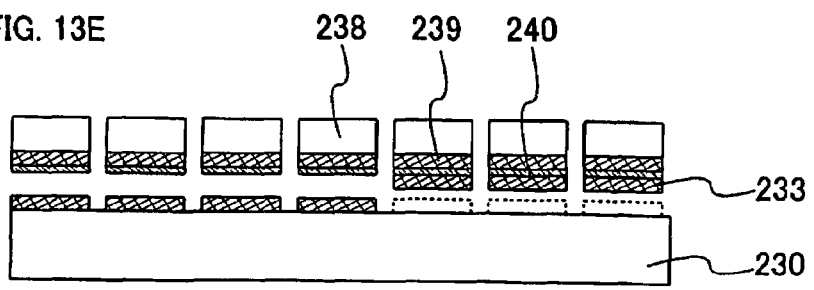

Next, the base 234 with the first thin film integrated circuit 233 attached thereto and the base 235 with the second thin film integrated circuit 236 attached thereto are pasted to each other (refer to FIG. 13D). The base 234 and the base 235 are pasted to each other so that the first thin film integrated circuit 233 and the second thin film integrated circuit 236 are electrically connected by the layer 237 including a conductive particle.

Subsequently, the base 234 and the base 235 are cut by a cutting means 228. Then, thin film integrated circuits (including the first thin film integrated circuit 233 and the second thin film integrated circuit 236) sealed by the base 234 and the base 235 are completed. The completed thin film integrated circuit includes a transistor, a storage element, and a conductive layer serving as an antenna, and is also referred to as a semiconductor device.

As another method, another step may be conducted after completing the base 234 with the first thin film integrated circuit 233 attached thereto (refer to FIG. 13C). This step uses a substrate 238 with the second thin film integrated circuit 239 provided, and a layer 240 including a conductive particle is provided in advance over the second thin film integrated circuit 239. Then, the thin film integrated circuit 233 is peeled from the substrate 230 so that the thin film integrated circuit 233 and the thin film integrated circuit 239 are electrically connected through the layer 240 including the conductive particle. Thus, a thin film integrated circuit in which the first thin film integrated circuit 233 and the second thin film integrated circuit 236 are electrically connected by the layer 237 including a conductive particle is completed.

The thin film integrated circuit completed at this time includes a transistor, a storage element, and a conductive layer serving as an antenna, and is also referred to as a semiconductor device. The completed thin film integrated circuit may be sealed further by a base.

A method for manufacturing a semiconductor device which is different from the above one will be described with reference to FIGS. 14A to 14D. Over a substrate 240, a peeling layer 241 and a layer 242 including a plurality of thin film integrated circuits are stacked (refer to FIG. 14A). The layer 242 including the plurality of thin film integrated circuits includes at least one or two selected from a transistor, a storage element, and a conductive layer serving as an antenna.

Figure 14A:
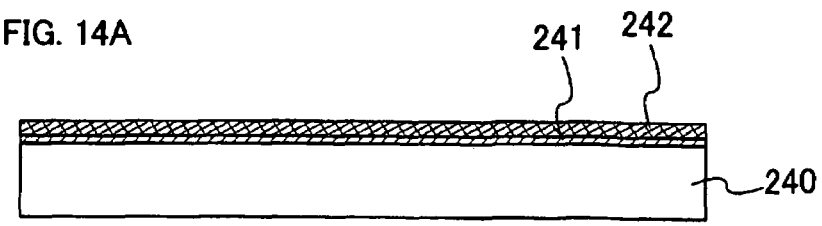
FIGS. 14A to 14D show a semiconductor device of the present invention.
Figure 14B:
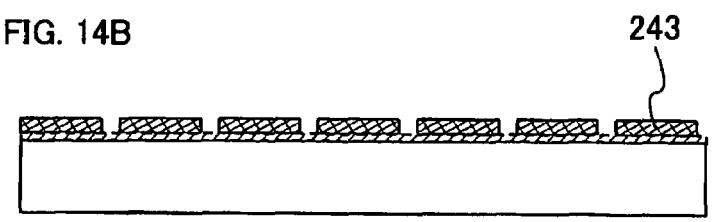
Figure 14C:
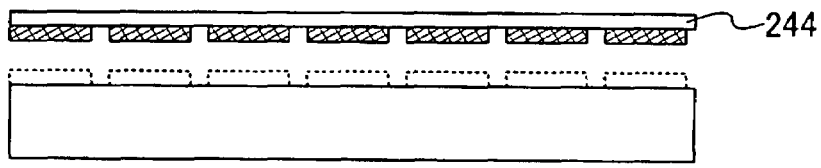

Next, an opening portion is formed selectively in the layer 242 including the plurality of thin film integrated circuits, thereby exposing the peeling layer 241 (refer to FIG. 14B). Subsequently, etchant is introduced into the opening portion to remove the peeling layer 241. Next, one plane of the first thin film integrated circuit 243 is attached to a base 244 and the thin film integrated circuit 243 is peeled from the substrate 240 (refer to FIG. 14C). Then, the base 244 with the first thin film integrated circuit 243 attached thereto is completed.

At this time, one plane of the thin film integrated circuit 243 is attached to the base 244, and the other plane of the thin film integrated circuit 243 is exposed. Therefore, it is preferable to conduct the following process: the other plane of the thin film integrated circuit 243 is provided with a connection terminal; the one plane of the thin film integrated circuit 243 is attached to the base 244; and then the connection terminal at the other plane of the thin film integrated circuit 243 is exposed. Then, the next step for electrically connecting the thin film integrated circuit 243 and the thin film integrated circuit 246 can be conducted easily.

Figure 14D:
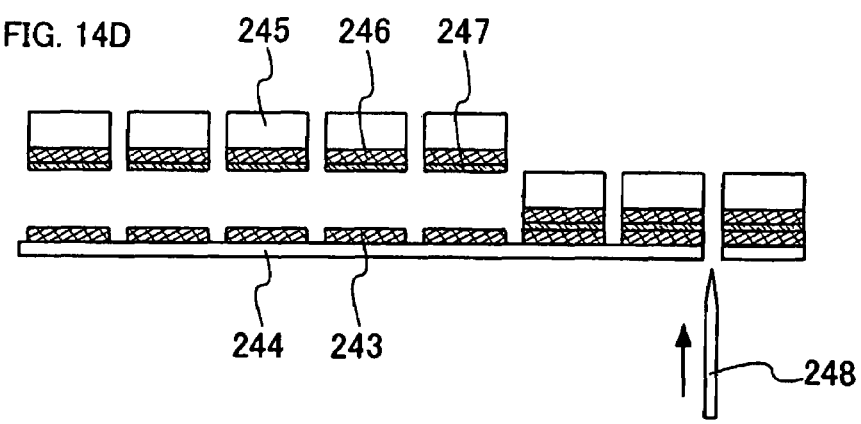

Next, a substrate 245 over which the thin film integrated circuit 246 has been provided is prepared (refer to FIG. 14D). Moreover, a layer 247 including a conductive particle is provided over the thin film integrated circuit 243 or the thin film integrated circuit 246. Here, the layer 247 including a conductive particle is provided over the thin film integrated circuit 246. Then, the thin film integrated circuit 243 and the thin film integrated circuit 246 are pasted to each other through the layer 247 including a conductive particle so that the thin film integrated circuit 243 and the thin film integrated circuit 246 are electrically connected. Next, the base 244 is cut by a cutting means 248. Through the above steps, a semiconductor device including the thin film integrated circuit 243 and the thin film integrated circuit 246 is completed.

The present embodiment mode can be freely combined with any one of the above Embodiment Modes.

[Embodiment Mode 10]

In the above embodiment mode, the layer 222 including the plural thin film integrated circuits is separated from the substrate 220 (refer to FIG. 12A); however, the present invention is not limited to this mode. The substrate 220 may be thinned after forming the layer 222 including the plural thin film integrated circuits over the substrate 220.

In order to thin the substrate 220, the other plane of the substrate 220 is ground by using a grinding device (for example, a grinding machine). It is preferable that the substrate 220 be ground until the thickness thereof becomes 100 µm or less. Next, the other plane of the ground substrate 220 is polished by using a polishing device (such as a polishing pad or an abrasive grain (for example cerium oxide or the like)). It is preferable that the substrate be polished until the thickness thereof becomes 50 µm or less, more preferably 20 µm or less, and much more preferably 5 µM or less. In order to thin the substrate 220, one of both of the grinding and the polishing is/are preferably conducted. Moreover, before the grinding step and the polishing step, a layer for protection is preferably provided over the layer 222 including the plural thin film integrated circuits, as necessary. After the grinding step and the polishing step, one or both of a washing step for removing dust and a drying step is/are preferably conducted, as necessary.

The thickness of the thinned substrate 220 is preferably determined appropriately in consideration of the time required for the grinding step and the polishing step, the time required for the cutting step to be conducted later, the intended purpose of the semiconductor device, the strength required for the intended purpose of the semiconductor device, and the like. For example, in the case of improving the productivity by shortening the time of the grinding step and the polishing step, the thickness of the polished substrate 220 is preferably about 50 µm. In the case of improving the productivity by shortening the time required for the cutting step to be conducted later, the thickness of the polished substrate 220 is preferably 20 µm or less, more preferably 5 µm or less. In the case of attaching the semiconductor device to a thin product or embedding the device into a thin product, the thickness of the polished substrate 220 is preferably 20 µm or less, more preferably 5 µm or less. The lower limit of the thickness of the thinned substrate 220 is not restricted in particular. The substrate may be thinned until the substrate 220 disappears (until the thickness of the substrate 220 becomes 0 µm).

After thinning the substrate 220, the substrate 220 is preferably cut as necessary. If the thinned substrate 220 remains, it is possible to prevent the intrusion of harmful gas, water, and an impurity element. Therefore, the deterioration and damage can be suppressed and the reliability can be enhanced. Moreover, the barrier property can be enhanced.

[Embodiment 1]

A conductive layer in a semiconductor device of the present invention is formed with a material containing one element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), lithium (Li), cesium (Cs), magnesium (Mg), calcium (Ca), strontium (Sr), europium (Er), ytterbium (Yb), and the like. Alternatively, the conductive layer is formed with an alloy material including the plural elements selected from the above elements or a conductive compound material.

The conductive layer in a semiconductor device of the present invention is formed by an evaporation method, a sputtering method, a CVD method, a printing method, or a droplet discharging method. The droplet discharging method is a method in which a composition including a conductive material is selectively discharged to form a conductive layer in any location and is referred to an ink-jet method depending on its system.

Data are written in a storage element by an electric action or an optical action. In the case of the electric action, it is necessary that one or both of a pair of conductive layers in the storage element has/have light-transmitting properties. A conductive layer having a light-transmitting property is formed with a conductive material having a light-transmitting property or, if the material does not have a light-transmitting property, formed with a thickness such that light can pass therethrough. As the conductive material having a light-transmitting property, indium tin oxide, indium tin oxide containing silicon, zinc oxide, indium zinc oxide, gallium-doped zinc oxide, or the like is given.

The storage element has a structure in which a layer containing an organic compound is sandwiched between a pair of conductive layers. The layer containing an organic compound can be formed with a known material, such as a low-molecular-weight material, a high-molecular-weight material, a singlet material, or a triplet material.

As the layer containing an organic compound, not only a layer containing just an organic compound material but also a material partially including an inorganic compound may be used. The layer containing an organic compound may be formed by appropriately combining a hole-injecting layer, a hole-transporting layer, a hole-blocking layer, a light-emitting layer, an electron-transporting layer, an electron-injecting layer, and the like. The layer containing an organic compound may be formed with a single layer or formed by stacking plural layers, or may have a mixed-type structure including plural layers whose boundaries are not clear.

The layer containing an organic compound is formed by a droplet discharging method typified by an ink jet method, an evaporation method, or the like. By using a droplet discharging method, it is possible to achieve increase in usage efficiency of the materials, shortening of the manufacturing time due to simplification of the manufacturing step, and decrease in the manufacturing cost.

As a specific material for the layer containing an organic compound, for example the following material having a high hole-transporting property is given: an aromatic amine compound (having a bond of a benzene ring and nitrogen) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4''-tris(N,N-diphenyl-amino)-triphenylamine (abbreviation: TDATA), 4,4',4''-tris[N-(3-methylphenyl)-N-phenyl-amino]-triphenylamine (abbreviation: MTDATA), or 4,4'-bis(N-(4-N,N-di-m-tolylamino)phenyl)-N-phenylamino)biphenyl (abbreviation: DNTPD); phthalocyanine (abbreviation: $H_2Pc$); or a phthalocyanine compound such as copper phthalocyanine (abbreviation: CuPc) or vanadyl phthalocyanine (abbreviation: VOPc).

As another organic compound material, for example the following material having a high electron-transporting property can be used: a material including a metal complex having a quinoline skeleton or a benzoquinoline skeleton, such as tris(8-quinolinolato)aluminum (abbreviation: $Alq_3$), tris(4-methyl-8-quinolinolato) aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq), or a metal complex having an oxazole ligand or a thiazole ligand, such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$). Moreover, in addition to the metal complex, the following compound can be used: 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenyl)-1,2,4-triazole (abbreviation: p-EtTAZ), bathophenanthroline (abbreviation: BPhen), or bathocuproin (abbreviation: BCP).

Further, as another organic compound material, the following material is given: 4-dicyanomethylene-2-methyl-6-(1,1,7,7-tetramethyljulolydil-9-enyl)-4H-pyrane (abbreviation: DCJT), 4-dicyanomethylene-2-t-butyl-6-(1,1,7,7-tetramethyljulolydil-9-enyl)-4H-pyrane, periflanthene, 2,5-dicyano-1,4-bis(10-methoxy-1,1,7,7-tetramethyljulolidyl-9-enyl)benzene, N,N'-dimethylquinacridone (abbreviation: DMQd), coumarin 6, coumarin 545T, tris(8-quinolinolato)aluminum (abbreviation: $Alq_3$), 9,9'-bianthryl, 9,10-diphenylanthracene (abbreviation: DPA), 9,10-bis(2-naphthyl) anthracene (abbreviation: DNA), 2,5,8,11-tetra-t-butylperylene (abbreviation: TBP), or the like. As a host material in the case of forming a layer in which the light-emitting material is diffused, the following can be used; an anthracene derivative such as 9,10-di(2-naphtyl)-2-tert-butylanthracene (abbreviation: t-BuDNA), a carbazole derivative such as 4,4'-bis(N-carbazolyl)biphenyl (abbreviation: CBP), a metal complex such as bis[2-(2-hydroxyphenyl)pyridinato]zinc (abbreviation: $Znpp_2$); or bis[2-(2-hydroxyphenyl)benzoxazolato]zinc (abbreviation: ZnBOX), or the like. Moreover, tris(8-quinolinolato)aluminum (abbreviation: $Alq_3$), 9,10-bis(2-naphtyl) anthracene (abbreviation: DNA), bis(2-methyl-8-quinolinolato)-4-phenylphenolato-aluminum (abbreviation: BAlq), or the like can be used.

Moreover, a material in which a metal oxide material is mixed in the above organic compound material may be used. As the metal oxide material, for example, molybdenum oxide, zinc oxide, or indium oxide is given. A material in which one or plural elements selected from these metal oxide materials is/are mixed in an organic compound material is preferably used.

In addition, the layer containing an organic compound can be formed with a material whose property changes by an optical action. For example, a conjugate polymer doped with a compound which generates acid by absorbing light (a photoacid generator) can be used. As the conjugate polymer, polyacetylenes, polyphenylenevinylenes, polythiophenes, polyanilines, polyphenylene ethynylenes, or the like can be used. As the photoacid generator, aryl sulfonium salt, aryl iodonium salt, o-nitrobenzyl tosylate, aryl sulfonic acid p-nitrobenzylester, sulfonyl acetophenones, Fe-allene complex PF6 salt, or the like can be used.

As the transistor in the semiconductor device of the present invention, a transistor whose channel portion is formed with amorphous semiconductor, crystalline semiconductor, microcrystal semiconductor, organic semiconductor, or the like is used. This embodiment can be freely combined with any one of the above Embodiment Modes.

[Embodiment 2]

An equivalent circuit diagram of a semiconductor device of the present invention and its operation will be described with reference to the drawings. The semiconductor device of the present invention comprises a memory cell array 202 in which memory cells 201 are arranged in a matrix form, a decoder 203, a decoder 204, a selector 205, and a read/write circuit 206 (refer to FIG. 9A). The memory cell 201 has a storage element 207.

The storage element 207 has a conductive layer 208 serving as a bit line Ba ($1 \leq a \leq m$), a conductive layer 209 serving as a word line Wb ($1 \leq b \leq n$), and a layer 210 containing an organic compound provided between the conductive layer 208 and the conductive layer 209 (refer to a top view of FIG. 10A and a cross-sectional view of FIG. 10B(1)). An insulating layer 211 is provided between the layers 210 containing an organic compound.

The conductive layer 208 extends in a first direction while the conductive layer 209 extends in a second direction perpendicular to the first direction. Both of the conductive layer 208 and the conductive layer 209 are provided in a stripe form. The conductive layer 208 and the conductive layer 209 are provided so as to intersect with each other.

Figure 11:
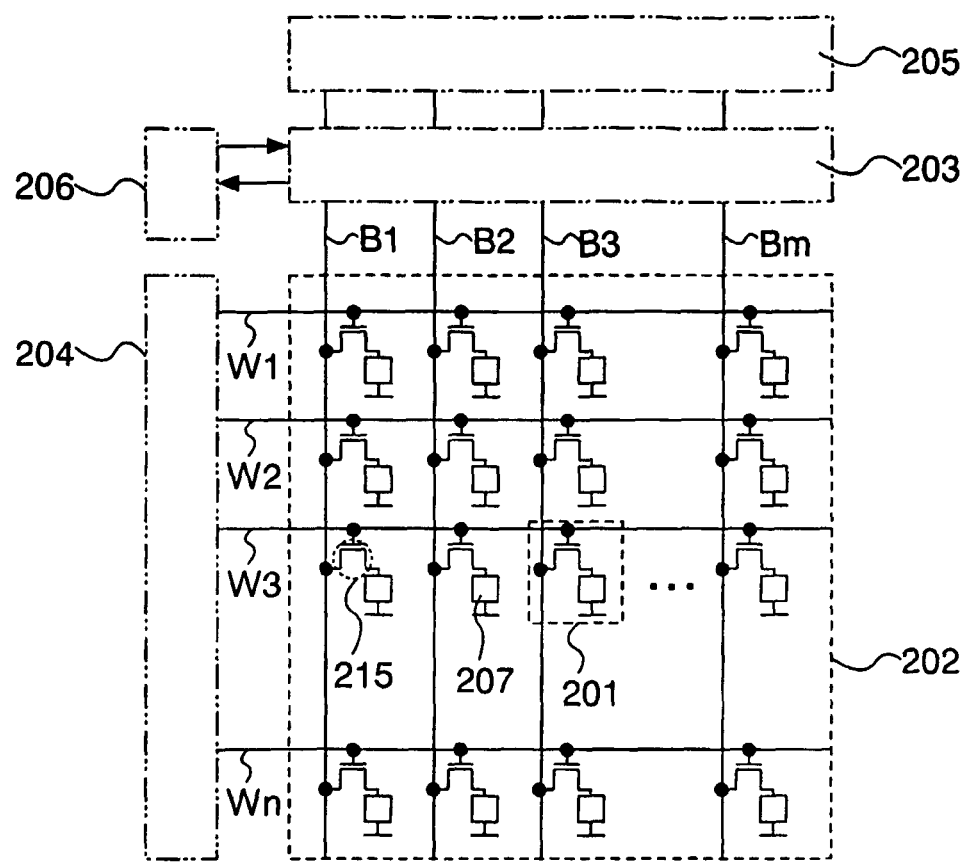
FIG. 11 shows a semiconductor device of the present invention.

The above structure applies to an active matrix type in which one storage element 207 is provided in one memory cell 201. However, the semiconductor device of the present invention may employ an active matrix type in which one storage element 207 and one transistor 215 are provided in one memory cell 201 (refer to FIG. 11).

Next, an operation for writing data in the semiconductor device having the above structure will be described. The data are written by an optical operation or an electric operation.

Figure 9A:
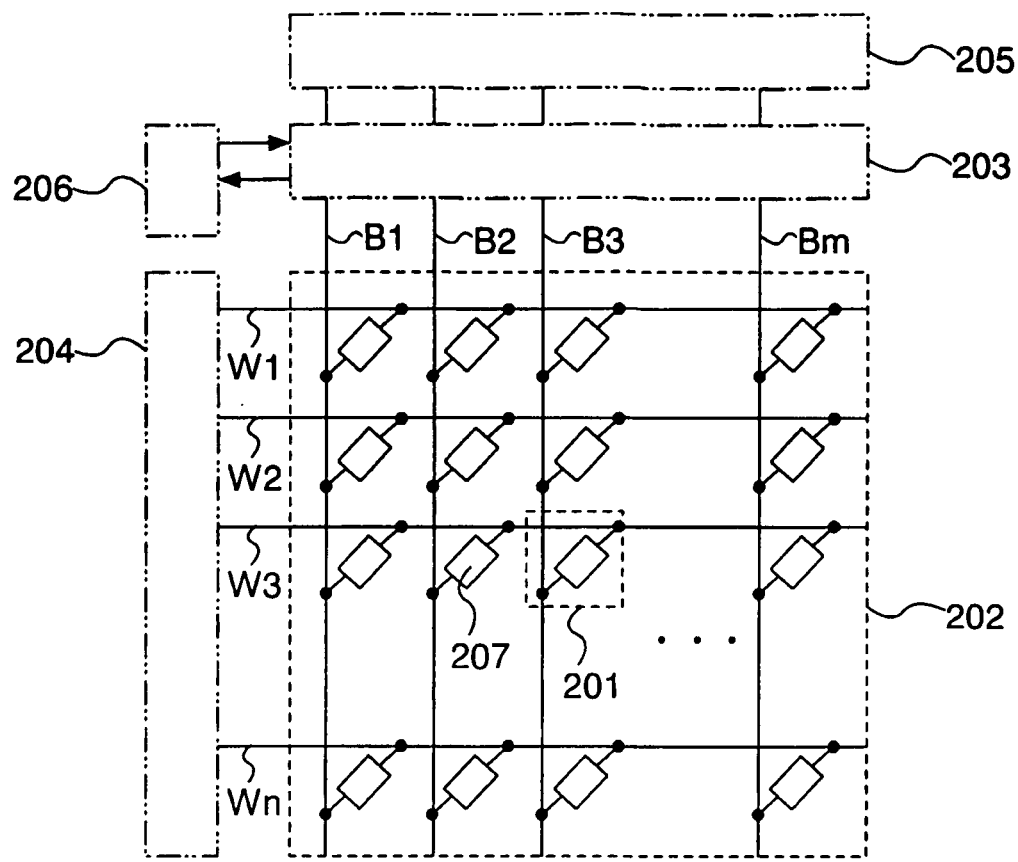
FIGS. 9A and 9B show a semiconductor device of the present invention.

First, a case of writing data by an electric action will be described (refer to FIG. 9A).

First, one memory cell 201 is selected by the decoders 203 and 204 and the selector 205. After that, data are written in the memory cell 201 by the read/write circuit 206.

More specifically, a predetermined amount of voltage is applied to the storage element 207 in the selected memory cell 201 to flow a large amount of current, thereby shortening between a pair of conductive layers of the storage element 207. The shorted storage element 207 has a much lower resistance value than the other storage elements 207. In this way, the data are written in the storage element 207 utilizing the change in the resistance value of the storage element 207 by applying the electric action. For example, if data of the storage element 207 to which the electric action has not been applied are assumed to be "0", data of "1" are written by applying voltage to the selected storage element 207 to flow a large amount of current for shortening the storage element 207. In other words, the resistance value of the storage element 207 is decreased.

The present invention is not limited to the mode in which data are written by shortening the storage element 207 in such a way that a predetermined amount of voltage is applied to the storage element 207. The data may be written in such a way that a predetermined amount of voltage is applied to the storage element 207 by adjusting an element structure of the storage element 207 or the amount of applied voltage to insulate the layer 210 containing an organic compound between the pair of conductive layers. In this case, the storage element 207 including the insulated layer 210 containing an organic compound has a much higher resistance value than the other storage elements 207. In this way, the data may be written utilizing the change in the resistance value of the storage element 207 by applying an electric action. For example, if data of the storage element 207 to which the electric action has not been applied are assumed to be "0", data of "1" are written by applying voltage to the selected storage element 207 to insulate the layer 210 containing an organic compound between the pair of conductive layers.

Next, a case is described in which data are written by an optical action (refer to FIGS. 10B(1) and 10B(2)). In this case, the data are written by irradiating the layer 210 containing an organic compound with laser light using a laser irradiation apparatus 212 from the light-transmitting conductive layer side (here the conductive layer 209). More specifically, the layer 210 containing an organic compound is broken by irradiating the layer 210 containing an organic compound in the selected storage element 207 with laser light. The broken layer 210 containing an organic compound is insulated, thereby having a much higher resistance value than the other storage elements 207. In this way, the data are written by utilizing the change in the resistance value of the storage element 207 by the laser irradiation. For example, if data of the storage element 207 to which the laser irradiation has not been conducted are assumed to be "0", data of "1" are written in such a way that the electric resistance is increased by irradiating the storage element 207 with laser light to break the storage element 207.

The present invention is not limited to the mode in which the data are written by insulating the layer 210 containing an organic compound in such a way that the storage element 207 is irradiated with the laser light. In the present invention, the data may be written in such a way that the storage element 207 is irradiated with laser light by adjusting an element structure of the storage element 207 or the intensity of the laser light to electrically break the layer 210 containing an organic compound, thereby shortening the pair of conductive layers. In this case, the storage element 207 in which the pair of conductive layers is shortened has a much lower resistance value than the other storage elements 207. In this way, the data may be written utilizing the change in the resistance value of the storage element 207 by applying the optical action.

When the layer 210 containing an organic compound formed with a conjugate polymer doped with a compound generating acid by absorbing light (photoacid generator) is irradiated with laser light, the irradiated portion in the layer 210 containing an organic compound has high conductivity, so that the resistance value of the storage element 207 decreases. On the other hand, the non-irradiated portion in the layer 210 containing an organic compound does not have conductivity and the resistance value of the storage element 207 does not change. In this case, the data are also written utilizing the change in the resistance value of the storage element 207 by irradiating the selected layer 210 containing an organic compound with the laser light. For example, if data of the storage element 207 to which the laser irradiation has not been conducted are assumed to be "0", data of "1" are written by irradiating the selected storage element 30 with laser light to increase the conductivity.

Figure 9B:
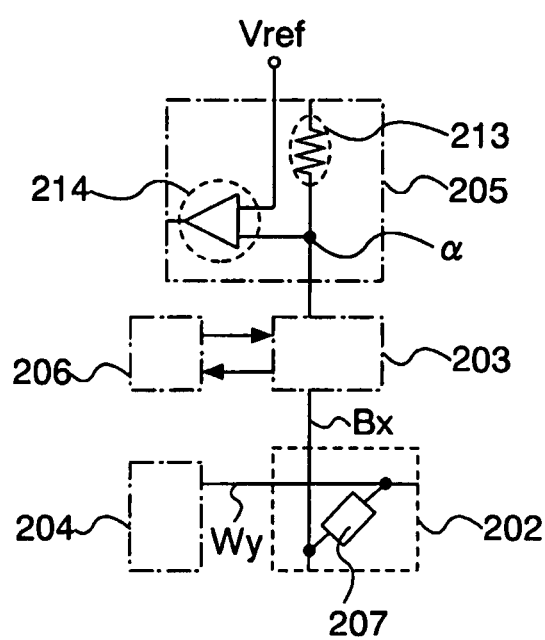

Subsequently, an operation when the data are read is described (refer to FIGS. 9A and 9B). Here, the read/write circuit 206 includes a resistance element 213 and a sense amplifier 214. However, the structure of the read/write circuit 206 is not limited to the above structure, and the read/write circuit 206 may have any structure.

The data are read by applying voltage between the conductive layer 208 and the conductive layer 209 to read the resistance value of the storage element 207. For example, in the case of writing the data by applying an electric action as described above, the resistance value of the storage element 207 with the electric action not applied thereto is different from that of the storage element 207 with the electric action applied thereto. The data are read by electrically reading such a difference in the resistance value.

The same thing applies to the case in which the data are written by irradiating the layer 210 containing an organic compound with laser light. The data are read by electrically reading the difference in the resistance value between the storage element 207 with an optical action not applied thereto and the storage element 207 with an optical action applied thereto.

The same thing also applies to the case in which the layer 210 containing an organic compound is formed with a conjugate polymer doped with a compound generating acid by absorbing light (photoacid generator). The data are read by electrically reading the difference in the resistance value between the storage element 207 with an optical action not applied thereto and the storage element 207 with an optical action applied thereto.

First, one memory cell 201 is selected by the decoder 203, the decoder 204, and the selector 205. Here, a bit line Bx in an x-th column and a word line Wy in a y-th row are selected. Then, the resistance element 213 and the storage element 207 in the memory cell 201 are in such a state that they are serially connected. Here, if voltage is applied to the opposite ends of the resistance element 213 and the storage element 207 connected serially, the electric potential of a node α becomes a resistance-divided electric potential in accordance with the resistance value of the storage element 207. The electric potential of the node α is supplied to the sense amplifier 214. In the sense amplifier 214, which of the information "0" and "1" is contained is judged. After that, a signal containing the information "0" or "1" judged by the sense amplifier 214 is supplied to the outside.

According to the above method, the information in the storage element 207 is read by its voltage value by using the difference in the resistance value and the resistance division. However, a method in which the current values are compared may be employed. This is, for example, a method using the difference in the current value due to the difference in the resistance value between the storage element 207 to which the electric action has been applied and the storage element 207 to which the electric action has not been applied. In this way, the data may be read by electrically reading the difference in the current value.

As a different structure from the above one, an element having a rectifying property may be provided between the first conductive layer 208 and the layer 210 containing an organic compound or between the conductive layer 209 and the layer 210 containing an organic compound. The element having a rectifying property is a transistor in which a gate electrode and a drain electrode are connected or a diode. As the diode, a diode including PN junction, a diode including PIN junction, or an avalanche diode is preferably used. In this way, the provision of the rectifying diode decreases the error and improves the margin of reading, because the current flows only in one direction.

The semiconductor device of the present invention is nonvolatile and additionally recordable, and data are written in the semiconductor device by an optical action or an electric action. This characteristic makes it possible to ensure security by preventing forgery caused by rewriting and to additionally record new data. Therefore, the present invention can provide a multi-functional, sophisticated, and high-value-added display device.

The semiconductor device of the present invention includes the storage element in which the layer containing an organic compound is sandwiched between the pair of conductive layers. Since the above structure of the storage element is the same as a light-emitting element, the manufacturing step does not increase. Further, since the structure is simple, an inexpensive display device can be easily manufactured. Moreover, since the area of the memory cell can be easily reduced, high integration is easy, and a semiconductor device of high capacity can be provided. The present embodiment can be freely combined with any one of the above Embodiment Modes and Embodiment.

[Embodiment 3]

Figure 15:
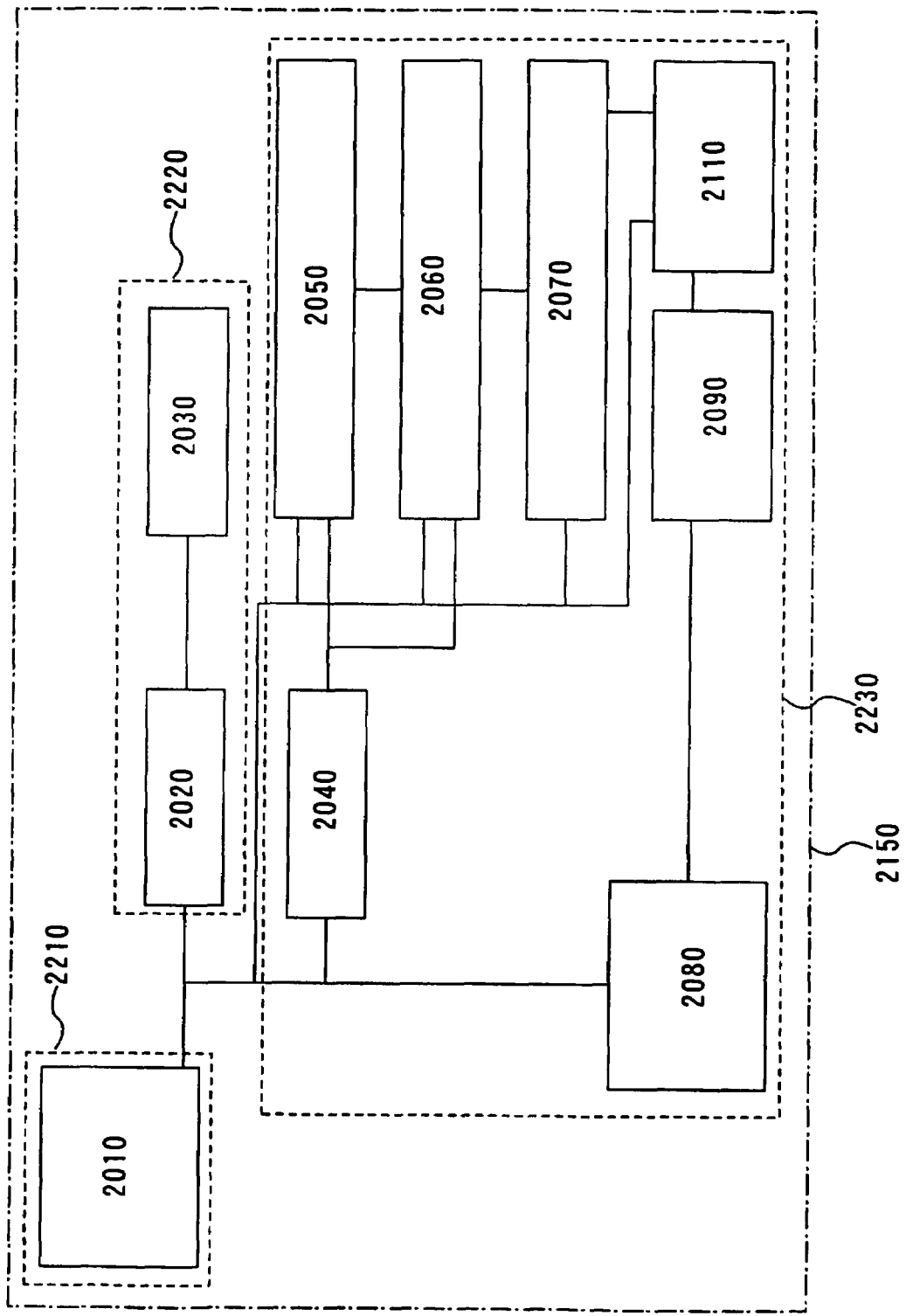
FIG. 15 shows a semiconductor device of the present invention.

A structure of a semiconductor device of the present invention will be described with reference to the drawings. The semiconductor device of the present invention includes an antenna portion 2210, a power source portion 2220, and a logic portion 2230 (refer to FIG. 15).

The antenna portion 2210 includes an antenna 2010 for receiving an external signal and sending data. The power source portion 2220 includes a rectifying circuit 2020 for producing power source in accordance with a signal received from outside through the antenna 2010, and a capacitor element 2030 for holding the produced power source. The logic portion 2230 has a demodulating circuit 2040 for demodulating the received signal, a clock generating circuit 2050 for generating a clock signal, a code recognizing and judging circuit 206, a memory controller 2070 for producing a signal for reading out data from the memory based on the received signal, a modulating circuit 2080 for modulating an encoded signal, an encoding circuit 2090 for encoding the read data, and a storage circuit 2110 for holding data.

Figure 16:
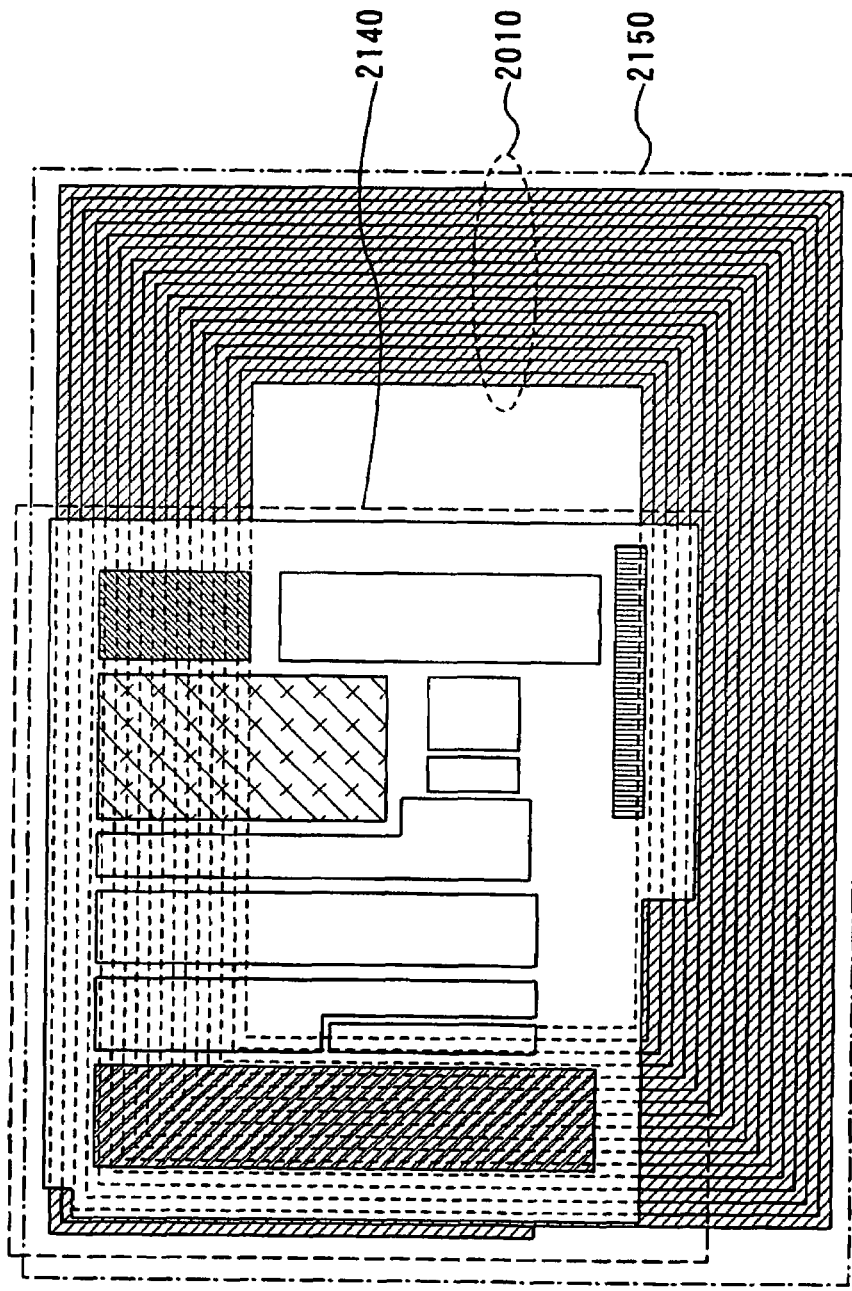
FIG. 16 shows a semiconductor device of the present invention.

Next, a layout of the semiconductor device will be described with reference to the drawings. First, a layout of the whole semiconductor device is described (refer to FIG. 16. In the semiconductor device, an element group 2140 for constituting parts of the power source portion 2220 and the logic portion 2230 is provided. The antenna 2010 is provided in the same layer as one conductive layer selected from the plural conductive layers in the element group 2140.

In the shown structure, a part of a region where the element group 2140 is provided overlaps with a part of a region where the antenna 2010 is provided. The width of a wiring for constituting a part of the antenna 2010 is designed to be 150 μm, the distance between the wirings is designed to be 10 μm, and the number of rolls is set to 15.

Figure 17:
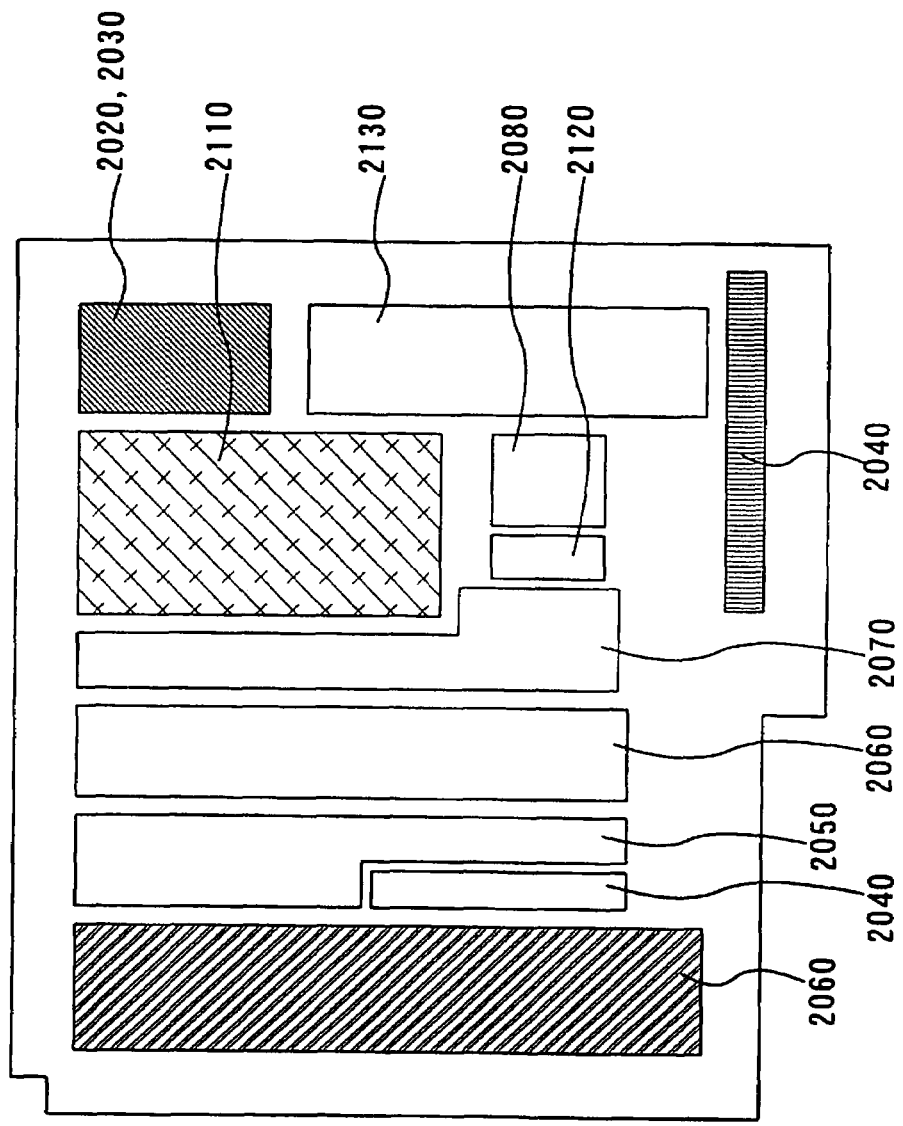
FIG. 17 shows a semiconductor device of the present invention.

Next, a layout of the power source portion 2220 and the logic portion 2230 are described (refer to FIG. 17). The rectifying circuit 2020 for constituting a part of the power source portion 2220 and the capacitor element 2030 are provided in the same region. The demodulating circuit 2040 for constituting a part of the logic portion 2230 and the code recognizing and judging circuit 2060 are provided separately in two positions. The storage circuit 2110 and the memory controller 2070 are provided adjacently. The clock generating circuit 2050 and the code recognizing and judging circuit 2060 are provided adjacently. The demodulating circuit 2040 is provided between the clock generating circuit 2050 and the code recognizing and judging circuit 2060. Although not shown in a block diagram of FIG. 15, a detecting capacitor 2120 for the logic portion and a detecting capacitor 2130 for the power source portion are provided. The modulating circuit 2080 is provided between the detecting capacitor 2120 and the detecting capacitor 2130. This embodiment can be freely combined with any one of the above Embodiment Modes.

[Embodiment 4]

A semiconductor device of the present invention can be applied to a wide range of purposes. For example, the semiconductor device can be attached to a bank note, a coin, documents of value, unregistered bonds, identification certificates (such as a driver's license or a residence card, refer to FIG. 18A), pack cases (such as a package paper or a bottle, refer to FIG. 18B), recording media (such as DVD software or a video tape, refer to FIG. 18C), vehicles (such as a bicycle, refer to FIG. 18D), personal belongings (such as a bag or glasses, refer to FIG. 18E), foods, clothes, general merchandise, electronic appliances, and the like. The electronic appliances include a liquid crystal display device, an EL display device, a television device (also referred to as a TV, a TV receiver, or a television receiver), and a mobile phone.

The semiconductor device of the present invention is fixed to a product by attaching the device onto a product or embedding the device inside a product. For example, if the product is a book, the device is fixed to the book by embedding the device inside a board of the front cover, and if the product is a package, the device is fixed to the package by embedding the device inside an organic resin which forms the package. Moreover, if the product is a bank note, a coin, documents of value, unregistered bonds, identification certificates, or the like, the device is attached to the surface or embedded therein. Among these products, for example, when the semiconductor device is provided to the pack cases, the recording media, the personal belongings, the foods, the clothes, the general merchandise, the electronic appliances, and the like, an inspection system, or a system at a rental shop can be made efficient.

Figure 19B:
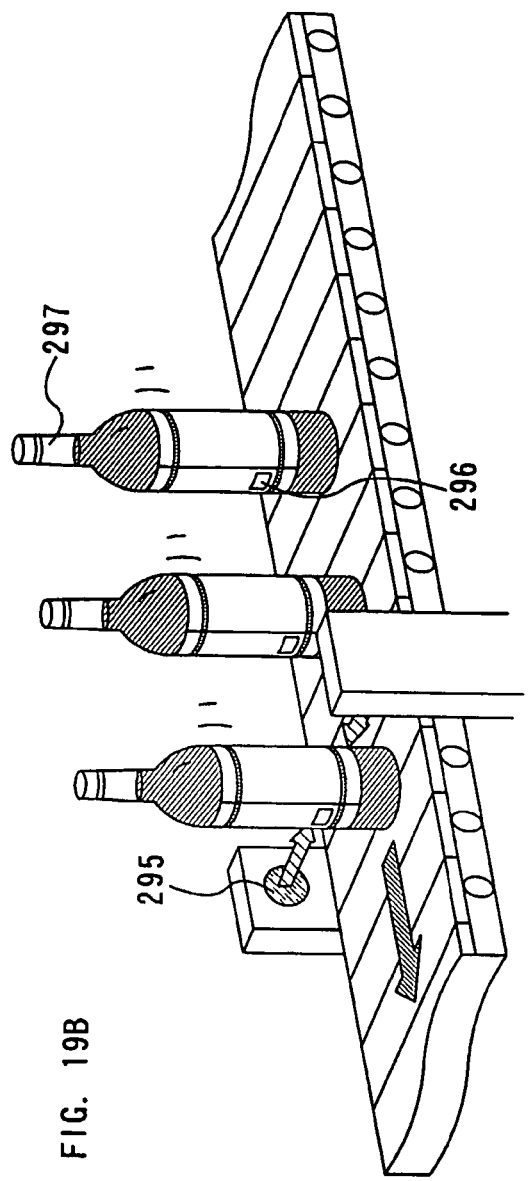
FIGS. 19A and 19B show usage patterns of a semiconductor device of the present invention.
Figure 19A:
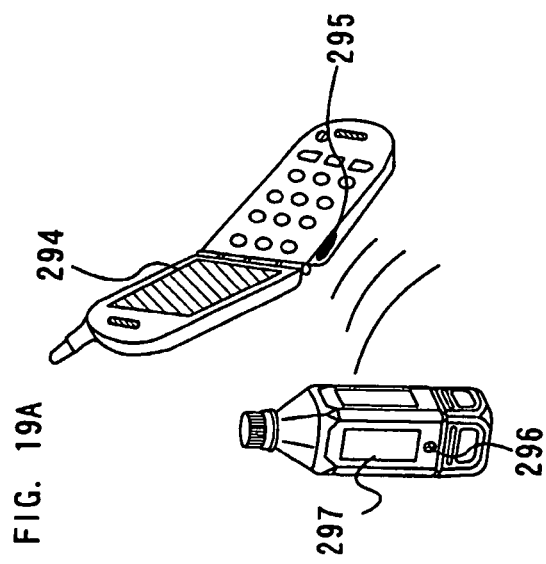

By using the semiconductor device in systems of management and circulation of products, the systems can be more sophisticated. For example, a reader/writer 295 is provided to a mobile terminal including a display portion 294 and a semiconductor device 296 is provided to a product 297. Then, when the semiconductor device 296 is held over the reader/writer 295, the display portion 294 can show a raw material, a production area, a history of a circulation process, and the like of the product 297. Thus, the system can be multi-functional and high-value-added (refer to FIG. 19A). As another example, the reader/writer 295 is provided beside a belt conveyer and the semiconductor device 296 is provided to the product 297. Then, the product 297 can be inspected easily and the system can be multi-functional (refer to FIG. 19B). This embodiment can be freely combined with any one of Embodiment Modes and Embodiments.

The semiconductor device of the present invention can use electric wave bands of: a long wave band of 135 kHz or less, a short wave band of 6.78 MHz, 13.56 MHz, 27.125 MHz, and 40.68 MHz, an ultrashort wave band of 433.92 MHz, 869.0 MHz, and 915.0 MHz, a microwave band of 2.45 GHz, 5.8 MHz, 24.125 GHz, and the like. This application is based on Japanese Patent Application serial no. 2005-014617 filed in Japan Patent Office on 21 Jan., 2005, and the entire contents of which are hereby incorporated by reference.

EXPLANATION OF REFERENCES

10: BASE, 11: SEMICONDUCTOR LAYER, 12: INSULATING LAYER, 13: CONDUCTIVE LAYER, 14: TRANSISTOR, 15: INSULATING LAYER, 16: CONDUCTIVE LAYER, 17: LAYER CONTAINING ORGANIC COMPOUND, 18: CONDUCTIVE LAYER, 19: CONDUCTIVE LAYER, 20: CONDUCTIVE LAYER, 21: CONDUCTIVE LAYER, 22: CONDUCTIVE LAYER, 23: STORAGE ELEMENT, 24: INSULATING LAYER, 25: CONDUCTIVE LAYER, 26: CONDUCTIVE LAYER, 27: CONDUCTIVE LAYER, 28: CONDUCTIVE LAYER, 29: CONDUCTIVE LAYER, 30: BASE, 31: SEMICONDUCTOR LAYER, 32: INSULATING LAYER, 33: CONDUCTIVE LAYER, 34: TRANSISTOR, 35: INSULATING LAYER, 36: CONDUCTIVE LAYER, 37: INSULATING LAYER, 38: LAYER CONTAINING ORGANIC LAYER, 39: CONDUCTIVE LAYER, 40: CONDUCTIVE LAYER, 41: CONDUCTIVE LAYER, 42: CONDUCTIVE LAYER, 43: CONDUCTIVE LAYER, 44: STORAGE ELEMENT, 45: CONDUCTIVE LAYER, 46: INSULATING LAYER, 47: CONDUCTIVE LAYER, 48: CONDUCTIVE LAYER, 49: CONDUCTIVE LAYER, 51: BASE, 52: CONDUCTIVE LAYER, 53: LAYER CONTAINING ORGANIC COMPOUND, 54: CONDUCTIVE LAYER, 55: BASE, 56: SEMICONDUCTOR LAYER, 57: INSULATING LAYER, 58: CONDUCTIVE LAYER, 59: TRANSISTOR, 60: INSULATING LAYER, 61: CONDUCTIVE LAYER, 62: CONDUCTIVE LAYER, 63: CONDUCTIVE LAYER, 64: CONDUCTIVE LAYER, 65: CONDUCTIVE PARTICLE, 66: LAYER INCLUDING CONDUCTIVE PARTICLE 67: INSULATING LAYER, 68: CONDUCTIVE LAYER, 69: CONDUCTIVE LAYER, 70: STORAGE ELEMENT, 71: BASE, 72: SEMICONDUCTOR LAYER, 73: INSULATING LAYER, 74: CONDUCTIVE LAYER, 75: TRANSISTOR, 76: INSULATING LAYER, 77: CONDUCTIVE LAYER, 78: INSULATING LAYER, 79: LAYER CONTAINING ORGANIC COMPOUND, 80: CONDUCTIVE LAYER, 81: CONDUCTIVE LAYER, 82: STORAGE ELEMENT, 90: BASE, 91: CONDUCTIVE LAYER, 92: LAYER CONTAINING ORGANIC COMPOUND, 93: CONDUCTIVE LAYER, 94: CONDUCTIVE LAYER, 95: BASE, 96: SEMICONDUCTOR LAYER, 97: INSULATING LAYER, 98: CONDUCTIVE LAYER, 99: TRANSISTOR, 100: INSULATING LAYER, 101: CONDUCTIVE LAYER, 102: CONDUCTIVE LAYER, 103: STORAGE ELEMENT, 111: INSULATING LAYER, 112: SEMICONDUCTOR LAYER, 113: INSULATING LAYER, 114: CONDUCTIVE LAYER, 115: INSULATING LAYER, 116: CONDUCTIVE LAYER, 117: CONDUCTIVE LAYER, 118: CONDUCTIVE LAYER, 119: CONDUCTIVE LAYER, 120: CONDUCTIVE LAYER, 121: TRANSISTOR, 122: INSULATING LAYER, 123: CONDUCTIVE LAYER, 124: CONDUCTIVE LAYER, 131: INSULATING LAYER, 132: SEMICONDUCTOR LAYER, 133: INSULATING LAYER, 134: CONDUCTIVE LAYER, 135: INSULATING LAYER, 136: CONDUCTIVE LAYER, 137: CONDUCTIVE LAYER, 201: MEMORY CELL, 202: MEMORY CELL ARRAY, 203: DECODER, 204: DECODER, 205: SELECTOR, 206: READ/WRITE CIRCUIT, 207: STORAGE ELEMENT, 208: CONDUCTIVE LAYER, 209: CONDUCTIVE LAYER, 210: LAYER CONTAINING ORGANIC COMPOUND, 211: INSULATING LAYER, 212: LASER IRRADIATION APPARATUS, 213: RESISTOR ELEMENT, 214: SENSE AMPLIFIER, 215: TRANSISTOR, 220: SUBSTRATE, 221: PEELING LAYER, 222: LAYER INCLUDING PLURAL THIN FILM INTEGRATED CIRCUITS, 223: THIN FILM INTEGRATED CIRCUIT, 224: BASE, 225: BASE, 226: SEALING ROLL, 227: SUPPLYING ROLL, 228: CUTTING MEANS, 229: BELT CONVEYER, 230: SUBSTRATE, 231: PEELING LAYER, 232: LAYER INCLUDING THIN FILM INTEGRATED CIRCUIT, 233: THIN FILM INTEGRATED CIRCUIT, 234: BASE, 235: BASE, 236: THIN FILM INTEGRATED CIRCUIT, 237: LAYER INCLUDING CONDUCTIVE PARTICLE, 238: SUBSTRATE, 239: THIN FILM INTEGRATED CIRCUIT, 240: SUBSTRATE, 241: PEELING LAYER, 242: LAYER INCLUDING PLURAL THIN FILM INTEGRATED CIRCUIT, 243: THIN FILM INTEGRATED CIRCUIT, 244: BASE, 245: SUBSTRATE, 246: THIN FILM INTEGRATED CIRCUIT, 247: LAYER INCLUDING CONDUCTIVE PARTICLE, 248: CUTTING MEANS, 249: LAYER INCLUDING CONDUCTIVE PARTICLE, 2010: ANTENNA, 2020: RECTIFYING CIRCUIT, 2030:

CAPACITOR ELEMENT, 2040: DEMODULATING CIRCUIT, 2050: CLOCK GENERATING CIRCUIT, 2060: JUDGING CIRCUIT, 2070: MEMORY CONTROLLER, 2080: MODULATING CIRCUIT, 2090: ENCODING CIRCUIT, 2110: STORAGE CIRCUIT, 2120: DETECTING CAPACITOR, 2130: DETECTING CAPACITOR, 2140: ELEMENT GROUP, 2210: ANTENNA PORTION, 2220: POWER SUPPLY PORTION, 2230: LOGIC PORTION

The invention claimed is:

1. A semiconductor device comprising:
   a transistor including a semiconductor layer, a first insulating layer serving as a gate insulating layer, and a first conductive layer serving as a gate electrode;
   a second insulating layer covering the transistor;
   a second conductive layer connected to an impurity region in the semiconductor layer through an opening portion provided in the second insulating layer;
   a layer containing an organic compound over and in contact with the second conductive layer;
   a third conductive layer over and in contact with the layer containing the organic compound; and
   a fourth conductive layer serving as an antenna;
   wherein a storage element comprises the second conductive layer, the layer containing the organic compound, and the third conductive layer,
   wherein the fourth conductive layer is provided in the same layer as the third conductive layer and includes the same material as the third conductive layer.

2. The semiconductor device according to claim 1,
   wherein the transistor, the second insulating layer, the second conductive layer, the layer containing the organic compound, the third conductive layer, and the fourth conductive layer are provided over one substrate.

3. The semiconductor device according to claim 1, further comprising:
   a fifth conductive layer, wherein the fifth conductive layer is interposed between the layer containing the organic compound and the second insulating layer.

4. A semiconductor device comprising:
   a transistor including a semiconductor layer, a first insulating layer serving as a gate insulating layer, and a first conductive layer serving as a gate electrode;
   a second insulating layer covering the transistor;
   a second conductive layer connected to an impurity region in the semiconductor layer through an opening portion provided in the second insulating layer;
   a third insulating layer covering the second conductive layer;
   a layer containing an organic compound in contact with the second conductive layer through an opening portion provided in the third insulating layer;
   a third conductive layer in contact with the layer containing the organic compound; and
   a fourth conductive layer serving as an antenna;
   wherein the fourth conductive layer is provided in the same layer as the third conductive layer and includes the same material as the third conductive layer.

5. The semiconductor device according to claim 4,
   wherein the transistor, the second insulating layer, the second conductive layer, the third insulating layer, the layer containing the organic compound, the third conductive layer, and the fourth conductive layer are provided over one substrate.

6. The semiconductor device according to claim 4, further comprising:
   a fifth conductive layer, wherein the fifth conductive layer is interposed between the layer containing the organic compound and the second insulating layer.

7. The semiconductor device according to claim 4,
   wherein a storage element comprises the second conductive layer, the layer containing the organic compound, and the third conductive layer.

8. The semiconductor device according to any one of claims 1 to 3 and claims 4 to 6, further comprising:
   one or more selected from a rectifying circuit, a modulating circuit, a demodulating circuit, a clock generating circuit, and an encoding circuit,
   wherein the one or more selected from the rectifying circuit, the modulating circuit, the demodulating circuit, the clock generating circuit, and the encoding circuit includes/include the transistor.

9. The semiconductor device according to any one of claims 1 to 3 and claims 4 to 6,
   wherein the antenna converts an electromagnetic wave into an alternating electric signal, and
   wherein a rectifying circuit for generating a power source potential based on the alternating electric signal supplied from the antenna is provided.

* * * * *